United States Patent
Kim

(10) Patent No.: US 12,015,425 B2
(45) Date of Patent: Jun. 18, 2024

(54) CONTROLLER AND OPERATING METHOD THEREOF FOR DETERMINING RELIABILITY DATA BASED ON SYNDROME WEIGHT

(71) Applicant: SK hynix Inc., Gyeonggi-do (KR)

(72) Inventor: Dae Sung Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/960,238

(22) Filed: Oct. 5, 2022

(65) Prior Publication Data
US 2023/0387941 A1 Nov. 30, 2023

(30) Foreign Application Priority Data
May 24, 2022 (KR) .................. 10-2022-0063666

(51) Int. Cl.
*H03M 13/00* (2006.01)
*H03M 13/11* (2006.01)
*H03M 13/15* (2006.01)

(52) U.S. Cl.
CPC .... *H03M 13/1575* (2013.01); *H03M 13/1111* (2013.01)

(58) Field of Classification Search
CPC .................. H03M 13/1575; H03M 13/1111
See application file for complete search history.

(56) References Cited

U.S. PATENT DOCUMENTS

| | | | |
|---|---|---|---|
| 9,184,954 B1* | 11/2015 | Alhussien | H03M 13/27 |
| 10,290,358 B2* | 5/2019 | Alhussien | G11C 29/52 |
| 2014/0237318 A1* | 8/2014 | Fitzpatrick | H03M 13/1102 |
| | | | 714/763 |
| 2016/0020784 A1* | 1/2016 | Tseng | H03M 13/1128 |
| | | | 714/752 |
| 2018/0012663 A1* | 1/2018 | Alhussien | H03M 13/1111 |
| 2018/0159560 A1* | 6/2018 | Sharon | H03M 13/1111 |
| 2019/0042356 A1* | 2/2019 | Chen | G11C 16/26 |
| 2023/0297273 A1* | 9/2023 | Kubota | G06F 3/0679 |
| | | | 711/154 |

FOREIGN PATENT DOCUMENTS

KR    10-2017-0068681 A    6/2017

\* cited by examiner

*Primary Examiner* — Samir W Rizk
(74) *Attorney, Agent, or Firm* — IP & T GROUP LLP

(57) ABSTRACT

A controller may include i) a storage memory configured to store N-bit read data and N reliability data units, ii) a decoder configured to execute a decoding operation for the read data based on the reliability data units, and iii) a processing circuit configured to determine a value of reliability data unit corresponding to I-th bit of read data based on an I-th bit of first read data, an I-th bit of second read data and a difference between first syndrome weight and second syndrome weight.

18 Claims, 17 Drawing Sheets

CONTROLLER AND OPERATING METHOD THEREOF FOR DETERMINING RELIABILITY DATA BASED ON SYNDROME WEIGHT

CROSS-REFERENCES TO RELATED APPLICATION

The present application claims priority under 35 U.S.C. 119(a) to Korean patent application number 10-2022-0063666 filed on May 24, 2022, which is incorporated herein by reference in its entirety.

TECHNICAL FIELD

The embodiments of the present disclosure relate to a controller and operating method of the controller for determining reliability data based on syndrome weight.

BACKGROUND

A memory system includes a data storage device that stores data on the basis of a request from a host, such as a computer, servers, a smartphone, a tablet PC, or other electronic devices. The examples of the memory system span from a traditional magnetic-disk-based hard disk drive (HDD) to a semiconductor-based data storage device such as a solid state drive (SSD), a universal flash storage (UFS) device, or an embedded MMC (eMMC) device.

The memory system may further include a memory controller for controlling a memory device. The memory controller may receive a command from the host and, on the basis of the received command, may execute the command or control read/write/erase operations on the memory devices in the memory system. The memory controller may be used to execute firmware operations for performing a logical operation for controlling such operations.

When the memory system reads data from the memory device, an error bit may be included in the read data. The memory system may perform hard-decision decoding and soft-decision decoding to correct an error bit included in the read data. In general, the memory system may execute soft-decision decoding when hard-decision decoding fails.

SUMMARY

Embodiments of the present disclosure may provide a controller and operating method thereof, capable of executing more robust error correction using read data.

In one aspect, embodiments of the present disclosure may provide a controller comprising i) a storage memory configured to store N-bit read data and N reliability data units each indicating reliability information for a corresponding bit of the read data; ii) a decoder configured to execute a decoding operation for the read data based on the reliability data units; and iii) a processing circuit configured to read first read data from a memory area located outside the controller based on a first read bias, read second read data from the memory area based on a second read bias, calculate a first syndrome weight corresponding to the first read data, calculate a second syndrome weight corresponding to the second read data, determine, as the read data, one of the first read data and the second read data based on the first syndrome weight and the second syndrome weight and determine a value of a reliability data unit corresponding to I-th bit of the read data based on an I-th bit of the first read data, an I-th bit of the second read data and a difference between the first syndrome weight and the second syndrome weight.

In another aspect, embodiments of the present disclosure may provide an operating method of the controller comprising calculating a first syndrome weight corresponding to first read data which is read from a memory area located outside of the controller based on a first read bias; calculating a second syndrome weight corresponding to second read data read from the memory area based on a second read bias; determining, as read data, one of the first read data and the second read data based on the first syndrome weight and the second syndrome weight; and determining a value of a reliability data unit corresponding to I-th bit of the read data based on an I-th bit of the first read data, an I-th bit of the second read data and a difference between the first syndrome weight and the second syndrome weight.

In another aspect, embodiments of the present disclosure may provide an operating method of the controller comprising selecting one of first and second codewords, which are individually read from a memory region according to different read biases, the selected codeword corresponding to a lesser one of first and second numbers of elements having a value of one (1) within respective syndromes of the first and second codewords; generating information representing reliability of the selected codeword, the information configured by one or more bit-reliability pieces each representing whether corresponding bits are the same as each other within the respective first and second codewords and whether, when the corresponding bits are different from each other, a difference between the first and second numbers falls within a threshold range; and decoding the selected codeword based on the information to provide a host with the decoded codeword as read data from the memory region.

According to embodiments of the present disclosure, it is possible to execute more robust error correction using read data.

DETAIL DESCRIPTION

Figure 1:
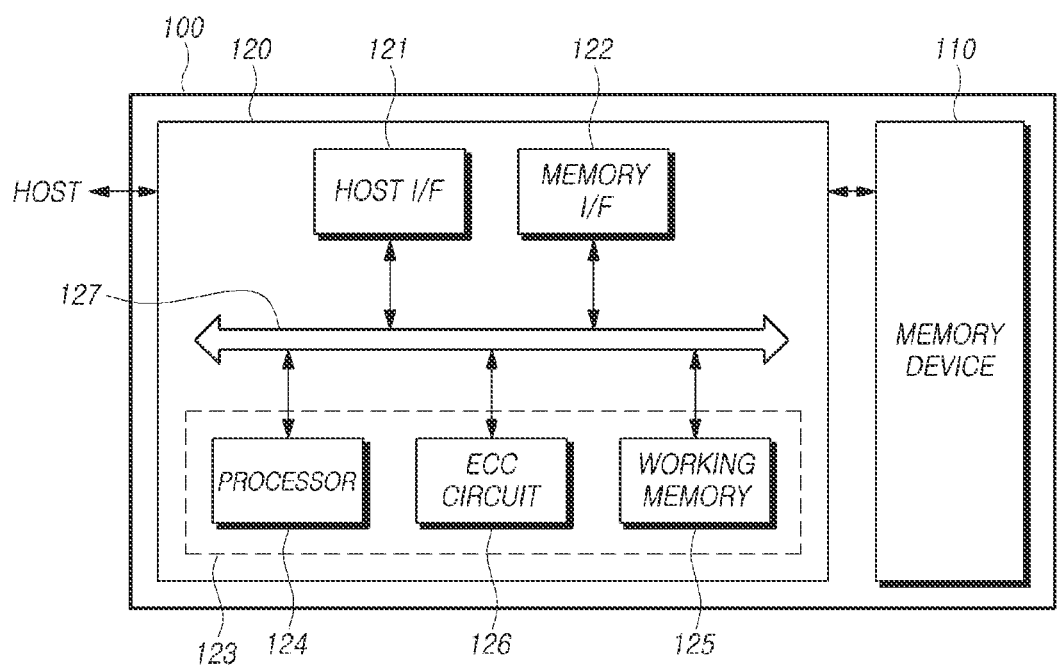
FIG. 1 is a schematic diagram illustrating a configuration of a memory system based on an embodiment of the present disclosure.

Hereinafter, embodiments of the present disclosure are described in detail with reference to the accompanying drawings. Throughout the specification, reference to "an embodiment," "another embodiment" or the like is not necessarily to only one embodiment, and different references to any such phrase are not necessarily to the same embodiment(s). The term "embodiments" when used herein does not necessarily refer to all embodiments.

Various embodiments of the present invention are described below in more detail with reference to the accompanying drawings. However, the present invention may be embodied in different forms and variations, and should not be construed as being limited to the embodiments set forth herein, Rather, the described embodiments are provided so that this disclosure will be thorough and complete, and will fully convey the present invention to those skilled in the art to which this invention pertains. Throughout the disclosure, like reference numerals refer to like parts throughout the various figures and embodiments of the present invention.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing methods herein.

When implemented at least partially in software, the controllers, processors, devices, modules, units, multiplexers, generators, logic, interfaces, decoders, drivers and other signal generating and signal processing features may include, for example, a memory or other storage device for storing code or instructions to be executed, for example, by a computer, processor, microprocessor, controller, or other signal processing device.

FIG. 1 is a diagram illustrating the schematic configuration of a memory system 100 based on an embodiment of the present disclosure.

In some implementations, the memory system 100 may include a memory device 110 configured to store data, and a memory controller 120 configured to control the memory device 110.

The memory device 110 may include multiple memory blocks each including a plurality of memory cells for storing data. The memory device 110 may be configured to operate in response to control signals received from the memory controller 120. Operations of the memory device 110 may include, for example, a read operation, a program operation (also referred to as a "write operation"), an erasure operation, and the like.

The memory cells in the memory device 110 are used to store data and may be arranged in a memory cell array. The memory cell array may be divided into memory blocks of memory cells and each block includes different pages of memory cells. In typical implementations of NAND flash memory devices, a page of memory cells is the smallest memory unit that can be programmed or written, and the data stored in memory cells can be erased at the block level.

In some implementations, the memory device 110 may be implemented as various types, such as a double data rate synchronous dynamic random access memory (DDR SDRAM), a low power double data rate4 (LPDDR4) SDRAM, a graphics double data rate (DDDR) SDRAM, a low power DDR (LPDDR), a Rambus dynamic random access memory (RDRAM), a NAND flash memory, a vertical NAND flash memory, a NOR flash memory, a resistive random access memory (RRAM), a phase-change random access memory (PRAM), a magnetoresistive random access memory (MRAM), a ferroelectric random access memory (FRAM or a spin transfer torque random access memory (STT-RAM).

The memory device 110 may be implemented in a three-dimensional array structure. Some embodiments of the present disclosure are applicable to any type of flash memory devices having an electric charge storage layer. In an implementation, the electric charge storage layer may be formed of a conductive material, and such an electric charge storage layer can be called a floating gate. In another implementation, the electric charge storage layer may be formed of an insulating material, and such a flash memory device can be called a charge trap flash (CTF).

The memory device 110 may be configured to receive a command and an address from the memory controller 120 to access an area of the memory cell array selected using the address. That is, the memory device 110 may perform an operation corresponding to the received command on a memory area of the memory device having a physical address corresponding to the received address from the memory controller 120.

In some implementations, the memory device 110 may perform a program operation, a read operation, an erasure operation, and the like. During the program operation, the memory device 110 may write data in the area selected by the address. During the read operation, the memory device 110 may read data from a memory area selected by the address, During the erasure operation, the memory device 110 may erase data stored in a memory area selected by the address.

The memory controller 120 may control write (program), read, erasure, and background operations that are performed on the memory device 110. The background operation may include, for example, operations that are implemented to optimize the overall performance of the memory device 110, such as a garbage collection (GC) operation, a wear leveling (WL) operation, and a bad block management (BBM) operation.

The memory controller 120 may control the operation of the memory device 110 at the request of a host. Alternatively, the memory controller 120 may control the operation of the memory device 110 even in absence of request from the host when it performs such background operations of the memory device.

The memory controller 120 and the host may be separate devices. In some implementations, the memory controller 120 and the host may be integrated and implemented as a single device. In the following description, the memory controller 120 and the host will be discussed as separate devices as an example.

Referring to FIG. 1, the memory controller 120 may include a memory interface (memory I/F) 122, a control circuit 123, and a host interface (host I/F) 121.

The host interface 121 may be configured to provide an interface for communication with the host.

When receiving a command from the host HOST, the control circuit 123 may receive the command through the host interface 121 and may perform an operation of processing the received command.

The memory interface 122 may be directly or indirectly connected to the memory device 110 to provide an interface for communication with the memory device 110. That is, the memory interface 122 may be configured to provide the memory device 110 and the memory controller 120 with an interface for the memory controller 120 to perform memory operations on the memory device 110 based on control signals and instructions from the control circuit 123.

The control circuit 123 may be configured to control the operation of the memory device 110 through the memory controller 120. For example, the control circuit 123 may include a processor 124 and a working memory 125. The control circuit 123 may further include an error detection/correction circuit (ECC circuit) 126 and the like.

The processor 124 may control the overall operation of the memory controller 120. The processor 124 may perform a logical operation. The processor 124 may communicate with the host HOST through the host interface 121. The processor 124 may communicate with the memory device 110 through the memory interface 122.

The processor 124 may be used to perform operations associated with a flash translation layer (FTL) to effectively manage the memory operations on the memory system 100. The processor 124 may translate a logical block address (LBA) provided by the host into a physical block address (PBA) through the FTL. The FTL may receive the LBA and translate the LBA into the PBA by using a mapping table.

There are various address mapping methods which may be employed by the FTL, based on the mapping unit, Typical address mapping methods may include a page mapping method, a block mapping method, and a hybrid mapping method.

The processor 124 may be configured to randomize data received from the host to write the randomized data to the memory cell array. For example, the processor 124 may randomize data received from the host by using a randomizing seed. The randomized data is provided to the memory device 110 and written to the memory cell array.

The processor 124 may be configured to derandomize data received from the memory device 110 during a read operation. For example, the processor 124 may derandomize data received from the memory device 110 by using a derandomizing seed. The derandomized data may be output to the host HOST.

The processor 124 may execute firmware (FW) to control the operation of the memory controller 120. In other words, the processor 124 may control the overall operation of the memory controller 120 and, in order to perform a logical operation, may execute (drive) firmware loaded into the working memory 125 during booting.

The firmware refers to a program or software stored on a certain nonvolatile memory and is executed inside the memory system 100.

In some implementations, the firmware may include various functional layers. For example, the firmware may include at least one of a flash translation layer (FTL) configured to translate a logical address in the host HOST requests to a physical address of the memory device 110, a host interface layer (HIL) configured to interpret a command that the host HOST issues to a data storage device such as the memory system 100 and to deliver the command to the FTL, and a flash interface layer (FIL) configured to deliver a command issued by the FTL to the memory device 110.

For example, the firmware may be stored in the memory device 110, and then loaded into the working memory 125.

The working memory 125 may store firmware, program codes, commands, or pieces of data necessary to operate the memory controller 120. The working memory 125 may include, for example, at least one among a static RAM (SRAM), a dynamic RAM (DRAM), and a synchronous RAM (SDRAM) as a volatile memory.

The error detection/correction circuit 126 may be configured to detect and correct one or more erroneous bits in the data by using an error detection and correction code. In some implementations, the data that is subject to the error detection and correction may include data stored in the working memory 125, and data retrieved from the memory device 110.

The error detection/correction circuit 126 may be implemented to decode data by using the error correction code. The error detection/correction circuit 126 may be implemented by using various decoding schemes. For example, a decoder that performs nonsystematic code decoding or a decoder that performs systematic code decoding may be used.

In some implementations, the error detection/correction circuit 126 may detect one or more erroneous bits on a sector basis, That is, each piece of read data may include multiple sectors. In the present disclosure, a sector may refer to a data unit that is smaller than the read unit (e.g., page) of a flash memory. Sectors constituting each piece of read data may be mapped based on addresses.

In some implementations, the error detection/correction circuit 126 may calculate a bit error rate (BER) and determine whether the number of erroneous bits in the data is within the error correction capability sector by sector. For example, if the BER is higher than a reference value, the error detection/correction circuit 126 may determine that the erroneous bits in the corresponding sector are uncorrectable and the corresponding sector is marked "fail." If the BER is lower than or equals to the reference value, the error detection/correction circuit 126 may determine that the corresponding sector is correctable or the corresponding sector can be marked "pass."

The error detection/correction circuit 126 may perform error detection and correction operations successively on all read data. When a sector included in the read data is correctable, the error detection/correction circuit 126 may move on to the next sector to check as to whether an error correction operation is needed on the next sector. Upon completion of the error detection and correction operations on all the read data in this manner, the error detection/correction circuit 126 may acquire information as to which sector is deemed uncorrectable in the read data. The error detection/correction circuit 126 may provide such information (e.g., address of uncorrectable bits) to the processor 124.

The memory system 100 may also include a bus 127 to provide a channel between the constituent elements 121, 122, 124, 125, and 126 of the memory controller 120. The bus 127 may include, for example, a control bus for delivering various types of control signals and commands, and a data bus for delivering various types of data.

By way of example, FIG. 1 illustrates the above-mentioned constituent elements 121, 122, 124, 125, and 126 of the memory controller 120. It is noted that some of those illustrated in the drawings may be omitted, or some of the above-mentioned constituent elements 121, 122, 124, 125, and 126 of the memory controller 120 may be integrated into a single element. In addition, in some implementations, one or more other constituent elements may be added to the above-mentioned to constituent elements of the memory controller 120.

Figure 2:
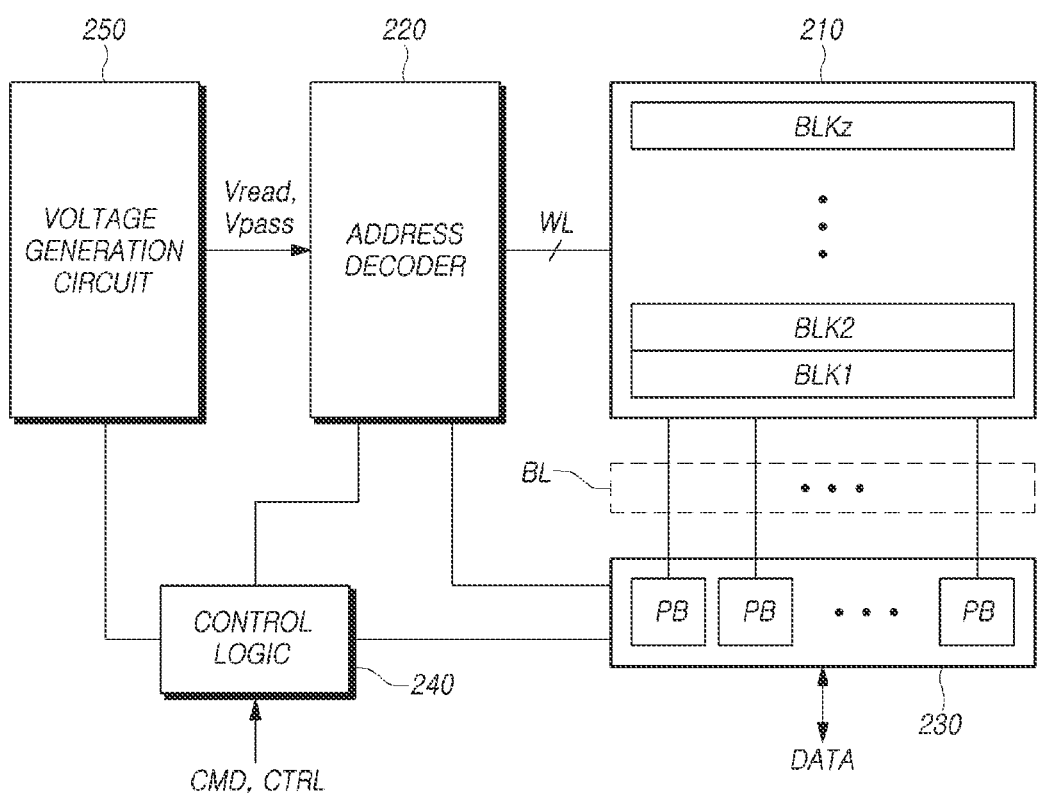
FIG. 2 is a block diagram schematically illustrating a memory device based on an embodiment of the present disclosure.

FIG. 2 is a block diagram schematically illustrating a memory device 110 based on an embodiment of the present disclosure.

In some implementations, the memory device 110 based on an embodiment of the present disclosure may include a memory cell array 210, an address decoder 220, a read/write circuit 230, a control logic 240, and a voltage generation circuit 250.

The memory cell array 210 may include multiple memory blocks BLK1-BLKz, where z is a natural number equal to or larger than 2.

In the multiple memory blocks BLK1-BLKz, multiple word lines WL and multiple bit lines BL may be disposed in rows and columns, and multiple memory cells MC may be arranged.

The multiple memory blocks BLK1-BLKz may be connected to the address decoder 220 through the multiple word lines WL. The multiple memory blocks BLK1-BLKz may be connected to the read/write circuit 230 through the multiple bit lines BL.

Each of the multiple memory blocks BLK1-BLKz may include multiple memory cells. For example, the multiple memory cells are nonvolatile memory cells. In some implementations, such nonvolatile memory cells may be arranged in a vertical channel structure.

The memory cell array 210 may be configured as a memory cell array having a two-dimensional structure. In some implementations, the memory cell array 210 may be arranged in a three-dimensional structure.

Each of the multiple memory cells included in the memory cell array 210 may store at least one bit of data. For example, each of the multiple memory cells included in the memory cell array 210 may be a single-level cell (SLC) configured to store one bit of data. As another example, each of the multiple memory cells included in the memory cell array 210 may be a multi-level cell (MLC) configured to store two bits of data per memory cell. As another example, each of the multiple memory cells included in the memory cell array 210 may be a triple-level cell (TLC) configured to store three bits of data per memory cell. As another example, each of the multiple memory cells included in the memory cell array 210 may be a quad-level cell (QLC) configured to store four bits of data per memory cell. As another example, the memory cell array 210 may include multiple memory cells, each of which may be configured to store at least five bits of data per memory cell.

Referring to FIG. 2, the address decoder 220, the read/write circuit 230, the control logic 240, and the voltage generation circuit 250 may operate as peripheral circuits configured to drive the memory cell array 210.

The address decoder 220 may be connected to the memory cell array 210 through the multiple word lines WL.

The address decoder 220 may be configured to operate in response to command and control signals of the control logic 240.

The address decoder 220 may receive addresses through an input/output buffer inside the memory device 110. The address decoder 220 may be configured to decode a block address among the received addresses. The address decoder 220 may select at least one memory block based on the decoded block address.

The address decoder 220 may receive a read voltage Vread and a pass voltage Vpass from the voltage generation circuit 250.

The address decoder 220 may, during a read operation, apply the read voltage Vread to a selected word line WL inside a selected memory block and apply the pass voltage Vpass to the remaining non-selected word lines WL.

The address decoder 220 may apply a verification voltage generated by the voltage generation circuit 250 to a selected word line WL inside a selected memory block, during a program verification operation, and may apply the pass voltage Vpass to the remaining non-selected word lines WL.

The address decoder 220 may be configured to decode a column address among the received addresses. The address decoder 220 may transmit the decoded column address to the read/write circuit 230.

The memory device 110 may perform the read operation and the program operation page by page. Addresses received when the read operation and the program operation are requested may include at least one of a block address, a row address, and a column address.

The address decoder 220 may select one memory block and one word line based on the block address and the row address. The column address may be decoded by the address decoder 220 and provided to the read/write circuit 230.

The address decoder 220 may include at least one of a block decoder, a row decoder, a column decoder, and an address buffer.

The read/write circuit 230 may include multiple page buffers PB. The read/write circuit 230 may operate as a "read circuit" when the memory cell array 210 performs a read operation, and may operate as a "write circuit" when the memory cell array 210 performs a write operation.

The above-mentioned read/write circuit 230 is also referred to as a page buffer circuit including multiple page buffers PB, or a data register circuit. The read/write circuit 230 may include a data buffer that participates in a data processing function and, in some implementations, may further include a cache buffer for data caching.

The multiple page buffers PB may be connected to the memory cell array 210 through the multiple bit lines BL. In order to detect or sense the threshold voltage Vth of the memory cells during a read operation and a program verification operation, the multiple page buffers PB may continuously supply a sensing current to the bit lines BL connected to the memory cells to detect, at a sensing node, a change proportional to the amount of current that varies depending on the program state of a corresponding memory cell, and may hold or latch the corresponding voltage as sensing data.

The read/write circuit 230 may operate in response to page buffer control signals output from the control logic 240.

During a read operation, the read/write circuit 230 senses a voltage value of a memory cell and the voltage value is read out as data. The read/write circuit 230 temporarily stores the retrieved data, and outputs the data DATA to the input/output buffer of the memory device 110. In an embodiment, the read/write circuit 230 may include a column selection circuit, in addition to the page buffers PB or page registers.

The control logic 240 may be connected to the address decoder 220, the read/write circuit 230, and the voltage generation circuit 250. The control logic 240 may receive a command CMD and a control signal CTRL through the input/output buffer of the memory device 110.

The control logic 240 may be configured to control the overall operation of the memory device 110 in response to the control signal CTRL. The control logic 240 may output a control signal for adjusting the voltage level of sensing nodes of multiple page buffers PB to a pre-charge voltage level.

The control logic 240 may control the read/write circuit 230 to perform a read operation in the memory cell array 210. The voltage generation circuit 250 may generate a read voltage Vread and a pass voltage Vpass, which are used during the read operation, in response to a voltage generation circuit control signal output from the control logic 240.

A memory block BLK included in the memory device 110 may include multiple pages PG, In some implementations, a plurality of memory cells arranged in columns form memory cell strings, and a plurality of memory cells arranged in rows form memory blocks. Each of the multiple pages PG is coupled to one of word lines WL, and each of the memory cell strings STR is coupled to one of bit lines BL.

In the memory block BLK, multiple word lines WL and multiple bit lines BL may be arranged in rows and columns. For example, each of the multiple word lines WL may be arranged in the row direction, and each of the multiple bit lines BL may be arranged in the column direction. As another example, each of the multiple word lines WL may be arranged in the column direction, and each of the multiple bit lines BL may be arranged in the row direction.

In some implementations, the multiple word lines WL and the multiple bit lines BL may intersect with each other, thereby addressing a single memory cell in the array of multiple memory cells MC. In some implementations, each memory cell MC may include a transistor TR that includes a material layer that can hold an electrical charge.

For example, the transistor TR arranged in each memory cell MC may include a drain, a source, and a gate. The drain (or source) of the transistor TR may be connected to the corresponding bit line BL directly or via another transistor TR. The source (or drain) of the transistor TR may be connected to the source line (which may be the ground) directly or via another transistor TR, The gate of the transistor TR may include a floating gate (FG) surrounded by an insulator, and a control gate (CG) to which a gate voltage is applied from a word line WL.

In each of the multiple memory blocks BLK1-BLKz, a first selection line (also referred to as a source selection line or a drain selection line) may be additionally arranged outside the first outermost word line, which is closer to the read/write circuit 230 among two outermost word lines, and a second selection line (also referred to as a drain selection line or a source selection line) may be additionally arranged outside the other second outermost word line.

In some implementations, at least one dummy word line may be additionally arranged between the first outermost word line and the first selection line. In addition, at least one dummy word line may be additionally arranged between the second outermost word line and the second selection line.

Figure 3:
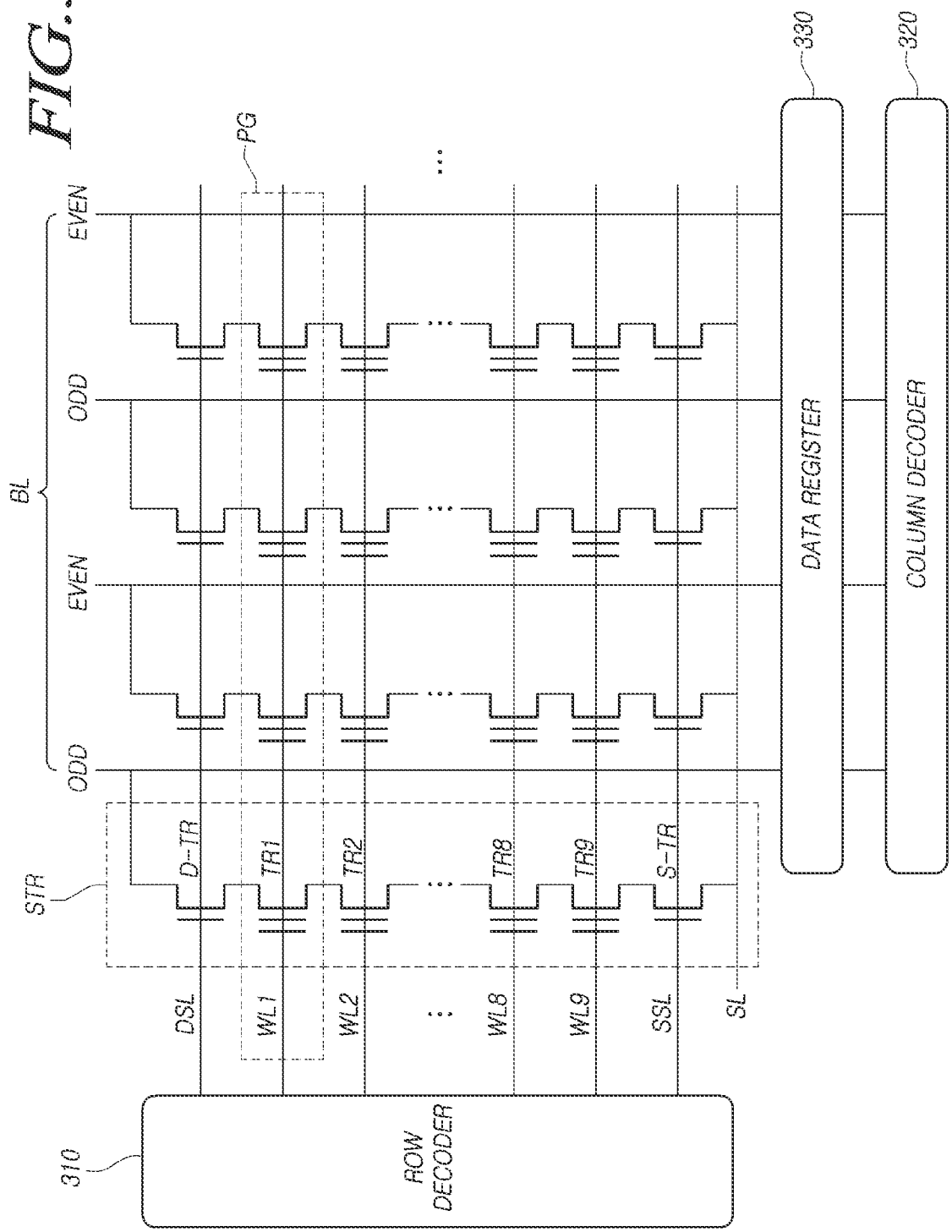
FIG. 3 is a diagram illustrating a structure of word lines and bit lines of a memory device based on an embodiment of the present disclosure.

A read operation and a program operation (write operation) of the memory block may be performed page by page, and an erasure operation may be performed memory block by memory block, FIG. 3 is a diagram illustrating a structure of word lines WL and bit lines BL of a memory device 110 based on an embodiment of the present disclosure.

Referring to FIG. 3, the memory device 110 has a core area in which memory cells MC are arranged, and an auxiliary area (the remaining area other than the core area) to include circuitry that is used to perform the operations of the memory cell array 210.

In the core area, a certain number of memory cells arranged in one direction can be called "page" PG, and a certain number of memory cells that are coupled in series can be called "memory cell string" STR.

The word lines WL1-WL9 may be connected to a row decoder 310. The bit lines BL may be connected to a column decoder 320. A data register 330, which corresponds to the read/write circuit 230 of FIG. 2, may exist between the multiple bit lines BL and the column decoder 320.

The multiple word lines WL1-WL9 may correspond to multiple pages PG.

For example, each of the multiple word lines WL1-WL9 may correspond to one page PG as illustrated in FIG. 3. When each of the multiple word lines WL1-WL9 has a large size, each of the multiple word lines WL1-WL9 may correspond to at least two (e.g., two or four) pages PG. Each page PG is the smallest unit in a program operation and a read operation, and all memory cells MC within the same page PG may perform simultaneous operations when conducting a program operation and a read operation.

The multiple bit lines BL may be connected to the column decoder 320. In some implementations, the multiple bit lines BL may be divided into odd-numbered bit lines BL and even-numbered bit lines BL such that a pair of an odd-numbered bit line and an even-numbered bit line is coupled in common to a column decoder 320.

In accessing a memory cell MC, the row decoder 310 and the column decoder 320 are used to locate a desired memory cell based on the address.

In some implementations, the data register 330 plays an important role because all data processing by the memory device 110, including program and read operations, occurs via the data register 330. If data processing by the data register 330 is delayed, all of the other areas need to wait unto the data register 330 finishes the data processing, degrading the overall performance of the memory device 110.

Referring to the example illustrated in FIG. 3, in one memory cell string STR, multiple transistors TR1-TR9 may be connected to multiple word lines WL1-WL9, respectively. In some implementations, the multiple transistors TR1-TR9 correspond to memory cells MC, In this example, the multiple transistors TR1-TR9 include control gates CG and floating gates FG.

The multiple word lines WL1-WL9 include two outermost word lines WL1 and WL9. A first selection line DSL may be additionally arranged outside the first outermost word line WL1, which is closer to the data register 330 and has a shorter signal path compared to the other outermost word line WL9. A second selection line SSL may be additionally arranged outside the other second outermost word line WL9.

The first selection transistor D-TR, which is controlled to turn on/off by the first selection line DSL, has a gate electrode connected to the first selection line DSL, but includes no floating gate FG. The second selection transistor S-TR, which is controlled to turn on/off by the second selection line SSL, has a gate electrode connected to the second selection line SSL, but includes no floating gate FG.

The first selection transistor D-TR is used as a switch circuit that connects the corresponding memory cell string STR to the data register 330. The second selection transistor S-TR is used as a switch circuit that connects the corresponding memory cell string STR to the source line SL. That is, the first selection transistor D-TR and the second selection transistor S-TR can be used to enable or disable the corresponding memory cell string STR.

In some implementations, the memory system 100 applies a predetermined turn-on voltage Vcc to the gate electrode of the first selection transistor D-TR, thereby turning on the first selection transistor D-TR, and applies a predetermined turn-off voltage (e.g., 0V) to the gate electrode of the second selection transistor S-TR, thereby turning off the second selection transistor S-TR.

The memory system 100 turns on both of the first and second selection transistors D-TR and S-TR during a read operation or a verification operation. Accordingly, during a read operation or a verification operation, an electric current may flow through the corresponding memory cell string STR and drain to the source line SL, which corresponds to the ground, such that the voltage level of the bit line BL can be measured. However, during a read operation, there may be a time difference in the on/off timing between the first selection transistor D-TR and the second selection transistor S-TR.

The memory system 100 may apply a predetermined voltage (e.g., +20V) to the substrate through a source line SL during an erasure operation. The memory system 100 applies a certain voltage to allow both the first selection transistor D-TR and the second selection transistor S-TR to float during an erasure operation. As a result, the applied erasure voltage can remove electrical charges from the floating gates FG of the selected memory cells.

Figure 4:
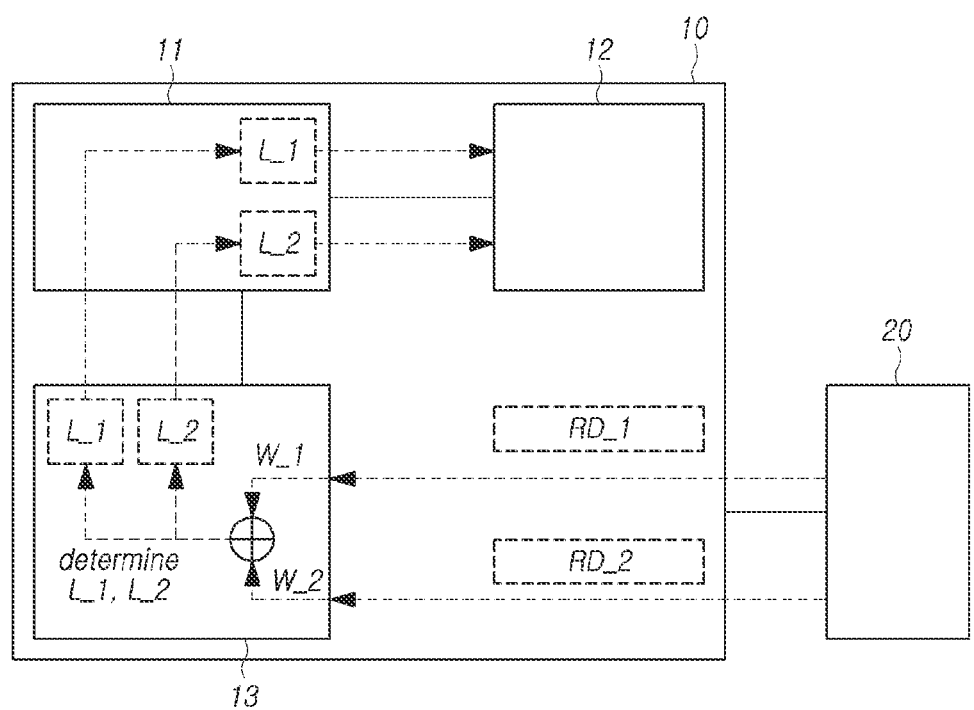
FIG. 4 illustrates an example of schematic operation of the controller according to embodiments of the present disclosure.

FIG. 4 illustrates an example of schematic operation of the controller 10 according to embodiments of the present disclosure.

Referring to FIG. 4, the controller 10 may include a storage memory 11, a decoder 12 and a processing circuit 13.

The storage memory 11 may store N-bit (N is a natural number) read data L_1 and reliability data L_2. In FIG. 4, a case in which the storage memory 11 is located outside the decoder 12 is described as an example, but the storage memory 11 may be located inside the decoder 12. As described later, the read data L_1 may be selected from first and second read data RD_1 and RD_2 or from first to third read data RD_1 to RD_3.

The reliability data L_2 is data indicating reliability of the read data L_1. The reliability data may indicate the reliability of the read data L_1 for each bit of the read data L_1. A bit of the read data L_1 having a high reliability has a lower error probability, and a bit of the read data L_1 having a low reliability has a higher error probability. Accordingly, it is possible to increase the decoding success probability of the read data L_1 based on the reliability of each bit of the read data L_1.

Hereinafter, the structure of the read data L_1 and the reliability data L_2 will be described in more detail in FIG. 5.

The decoder 12 may execute a decoding operation for the read data L_1 based on the read data L_1 and the reliability data L_2. The read data L_1 may be data read from a memory area 20.

The memory area 20 is an area located outside the controller 10, and the memory area 20 may store data. One bit or more of data may be stored in the memory area 20, and the controller 10 may read data stored in the memory area 20.

The decoder 12 may perform a decoding operation according to a preset algorithm using the read data L_1 and the reliability data L_2.

For example, the decoder 12 may perform a decoding operation based on min-sum algorithm.

As another example, the decoder 12 may input the read data L_1 and the reliability data L_2 to a preset error function, and may determine whether to execute a flip operation on the K-th (K is an integer greater than or equal to 0) bit of the read data L_1 based on the result of the error function.

For example, the error function may output a plurality of result values proportional to the error probability of the K-th bit of the read data L_1. The error function may output a first result value when the value of the K-th bit of the read data L_1 is 1, and output a second result value when the value of the K-th bit of the read data L_1 is 0. As the result value from the error function increases, the error probability of the K-th bit of the read data L_1 may increase.

When the result value of the error function for the K-th bit of the read data L_1 is equal to or greater than the first result value, the decoder 12 may perform a flip operation on the K-th bit of the read data L_1.

If the error probability value for the K-th bit of the read data L_1 is less than a first threshold error probability value and greater than or equal to a second threshold error probability value (in this case, the second threshold error probability value is less than the first threshold error probability value), the decoder 12 may determine whether to perform a flip operation on the K-th bit of the read data L_1 based on a reliability value corresponding to the K-th bit of the read data L_1 in the reliability data L_2.

For example, when the reliability value corresponding to the K-th bit of the read data L_1 is less than a threshold reliability value (that is, when reliability is low), the decoder 12 may perform a flip operation on the K-th bit of the read data L_1.

On the other hand, when the reliability value corresponding to the K-th bit of the read data is greater than or equal to the threshold reliability value (that is, when reliability is high), the decoder 12 may not perform a flip operation on the K-th bit of the read data 1_1. In this case, the decoder 12 may change the reliability data L_2 so that the reliability value corresponding to the K-th bit of the read data L_1 is less than the threshold reliability value.

The processing circuit 13 may read the first read data RD_1 from the memory area 20 based on a first read bias.

The processing circuit 13 may read the second read data RD_2 from the memory area 20 based on a second read bias.

In this case, the first read data RD_1 and the second read data RD_2 may be read data whose reliability is not evaluated through an additional read operation. For example, when a specific read bias is applied to a word line of a memory cell included in the memory area 20, data stored in the corresponding memory cell may have a specific value (e.g., 1 or 0) according to an on/off state of the corresponding memory cell. Thereafter, reliability of data read from the corresponding memory cell may not be evaluated.

When different read biases are applied to the word line of the same memory cell, data read from the corresponding memory cell may be different. Accordingly, when the first read bias and the second read bias are different, the first read data RD_1 and the second read data RD_2 may also be different from each other.

Meanwhile, information on the positional correlation between the first read bias and the second read bias may not be given. In this case, it is difficult to determine the reliability of data read from the memory area 20 by simply comparing the first read data RD_1 and the second read data RD_2.

Therefore, in the embodiments of the present disclosure, the processing circuit 13 of the controller 10 may calculate syndrome weights for the first read data RD_1 and the second read data RD_2 and uses the calculated syndrome weights to determine reliability data for the data read from the memory area 20, in order to secure reliability information on data read from the memory area 20. Through this, the processing circuit 13 may perform robust error correction based on read data read from the memory area 20.

The processing circuit 13 may calculate a first syndrome weight W_1, which is syndrome weight for the first read data RD_1.

The processing circuit 13 may calculate a second syndrome weight W_2, which is syndrome weight for the second read data RD_2.

The syndrome weight for the read data may be determined as the number of syndrome elements having a preset value (e.g., 1) among the syndrome elements included in the syndrome corresponding to the read data.

For example, the processing circuit 13 may generate a data chunk vector r based on a data chunk including read data. When data chunk is N bits (N is a natural number), the data chunk vector may have N data chunk elements.

The processing circuit 13 may generate a syndrome S=H*r by performing a multiplication operation on a preset parity check matrix H and the data chunk vector r. In this case, the read data may be used to calculate syndrome elements included in the syndrome.

The processing circuit 13 may determine the number of syndrome elements having the preset value among the syndrome elements included in the syndrome as the syndrome weight for the read data. The processing circuit 13 may determine that the probability of an error occurring in the corresponding read data increases as the value of the syndrome weight for the read data increases.

The processing circuit 13 may determine the read data L_1 from among the first read data RD_1 and the first read data RD_2 based on the first syndrome weight W_1 and the second syndrome weight W_2.

The processing circuit 13 may determine, among N reliability data units configuring the reliability data respectively corresponding to the N bits within the read data and respectively representing the reliabilities of the N bits within the read data, a value of reliability data unit corresponding to the I-th (I is an integer greater than 0) bit of the read data L_1 based on i) an I-th bit of the first read data RD_1, i) an I-th bit of the second read data RD_2, and iii) a difference between the first syndrome weight W_1 and the second syndrome weight W_2. Embodiments in which the processing circuit 13 determines the value of the reliability data unit corresponding to the I-th bit of the read data L_1 will be described below.

The above-described controller 10 and the storage memory 11, the decoder 12, and the processing circuit 13 included in the controller 10 may be implemented in various ways.

For example, the controller 10 may be the memory controller 120 described in FIG. 1. In this case, the storage memory 11 may be the working memory 125 in the memory controller 120 or a separate volatile memory (e.g., SRAM, DRAM, register). The decoder 12 may be the error detection/correction circuit 126 in the memory controller 120. Also, the processing circuit 13 may be the processor 124 included in the memory controller 120.

As another example, the controller 10 may be a separate computing device (e.g., embedded system, smartphone, desktop, laptop). In this case, the storage memory 11 may be a volatile memory (e.g., SRAM, DRAM, register) included in the computing device. The decoder 12 may be a decoding module included in the computing device. The processing circuit 13 may be a microprocessor, CPU, SoC, etc. included in the computing device.

In addition, the above-described memory area 20 may also be determined in various ways. For example, the memory area may be a part of the memory device 110 in FIG. 1. For example, the memory area 20 may be one or more memory cells included in the memory device 110.

Figure 5:
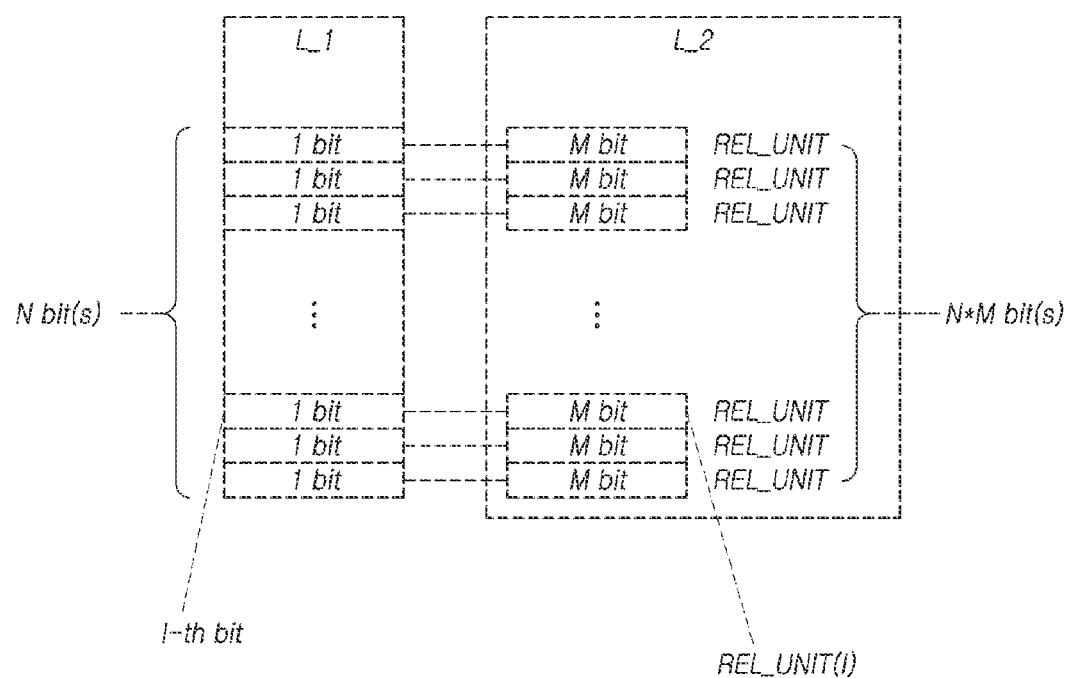
FIG. 5 illustrates structure of read data and reliability data according to embodiments of the present disclosure.

FIG. 5 illustrates structure of read data L_1 and reliability data L_2 according to embodiments of the present disclosure.

Referring to FIG. 5, the read data L_1 is N-bit data, and each bit of the read data L_1 corresponds to an M-bit reliability data unit REL_UNIT, In FIG. 5, the reliability data L_2 may include N reliability data units REF_UNIT.

The reliability data unit REL_UNIT may indicate reliability information for a specific bit of the read data L_1 to which the reliability data unit REL_UNIT corresponds. A reliability data unit REL_UNIT(I) corresponding to the I-th bit of the read data L_1 may exist.

In this case, M may be greater than or equal to 1, For example, each bit of the read data L_1 may correspond to a reliability data unit REL_UNIT having a size of 2 bits.

In this case, the total size of the reliability data L_2 is N*M bits. This is because there are N reliability data units of M-bit size, FIG. 6 illustrates an example of an operation in which the controller 10 calculates the first syndrome weight W_1 and the second syndrome weight W_2 according to embodiments of the present disclosure.

Figure 6:
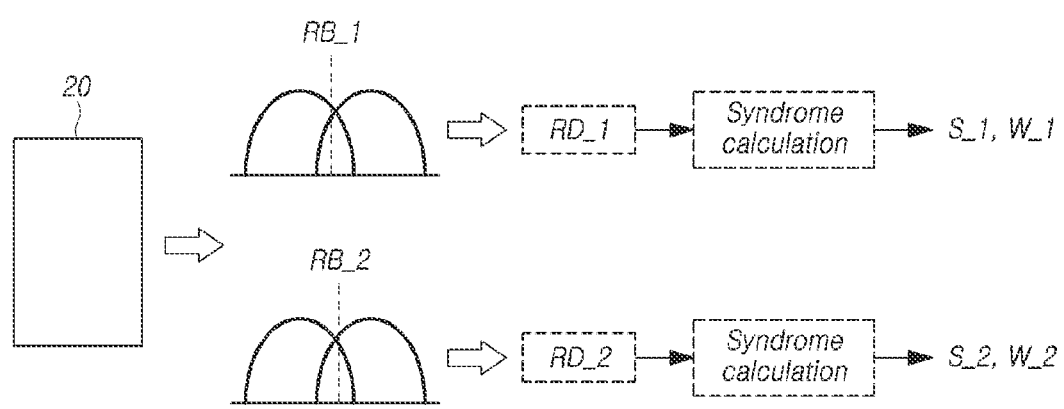
FIG. 6 illustrates an example of an operation in which the controller calculates the first syndrome weight and the second syndrome weight according to embodiments of the present disclosure.

Referring to FIG. 6, the processing circuit 13 of the controller 10 may read the first read data RD_1 and the second read data RD_2.

As described above, the first read data RD_1 is a result of reading data stored in the memory area 20 based on the first read bias RB_1. The second read data RD_2 is a result of reading data stored in the memory area 20 based on the second read bias RB_2.

In this case, the second read bias RB_2 is different from the first read bias RB_1. Since the second read bias RB_2 and the first read bias RB_1 are different from each other, the first read data RD_1 and the second read data RD_2 may be different from each other even though both the first read data RD_1 and the second read data RD_2 are read from the memory area 20.

In FIG. 6, only two threshold voltage distributions are illustrated taking the case where 1 bit is stored in a memory cell included in the memory area 20 as an example, but embodiments of the present disclosure are not limited thereto. That is, when Q bits (Q is a natural number greater than or equal to 2) are stored in a memory cell, $2^Q$ threshold voltage distributions may be generated. That is, in the case of MLC, TLC, and QLC, 4, 8, and 16 threshold voltage distributions may be generated respectively.

The processing circuit 13 may calculate a first syndrome S_1 that is a syndrome with respect to the first read data RD_1, and calculate the first syndrome weight W_1 that is a weight of the first syndrome S_1 based on the calculated first syndrome S_1. The processing circuit 13 may calculate a second syndrome S_2 that is a syndrome with respect to the second read data RD_2, and calculate the second syndrome weight W_2 that is a weight of the second syndrome S_2 based on the calculated second syndrome S_2.

Figure 7:
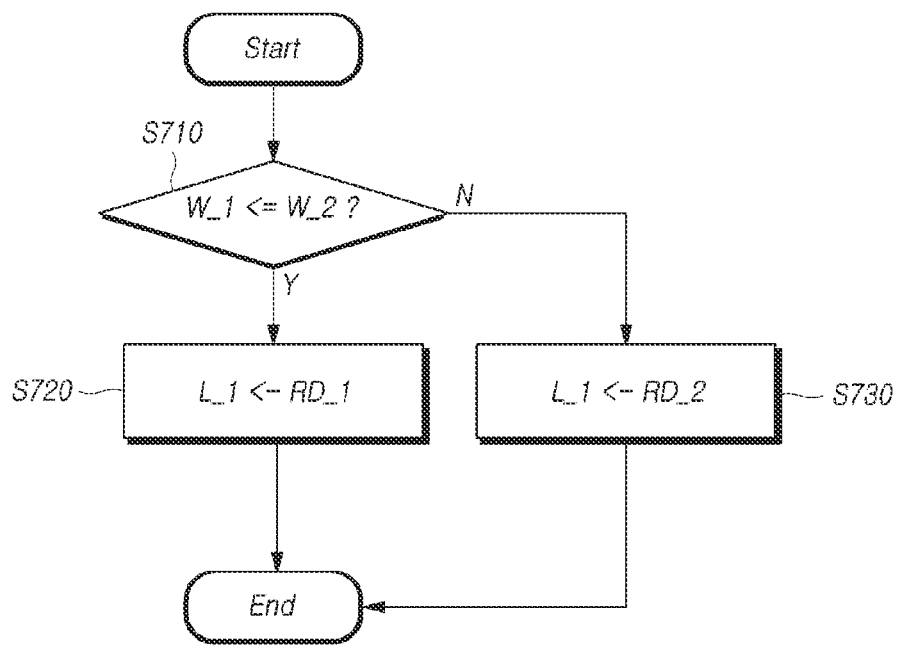
FIG. 7 illustrates an example of an operation in which the controller determines the read data according to embodiments of the present disclosure.

FIG. 7 illustrates an example of an operation in which the controller 10 determines the read data L_1 according to embodiments of the present disclosure.

Referring to FIG. 7, the processing circuit 13 of the controller 10 may determine whether the first syndrome weight W_1 is less than or equal to the second syndrome weight W_2 (S710).

When the first syndrome weight W_1 is less than or equal to the second syndrome weight W_2 (S710—Y), the processing circuit 13 may determine the read data L_1 as the first read data RD_1 (S720).

On the other hand, when the first syndrome weight W_1 is greater than the second syndrome weight W_2 (S710—N), the processing circuit 13 may determine the read data L_1 as the second read data RD_2 (S730).

That is, the processing circuit 13 may determine read data having a smaller syndrome weight among the first read data RD_1 and the second read data RD_2 as the read data L_1.

Figure 8:
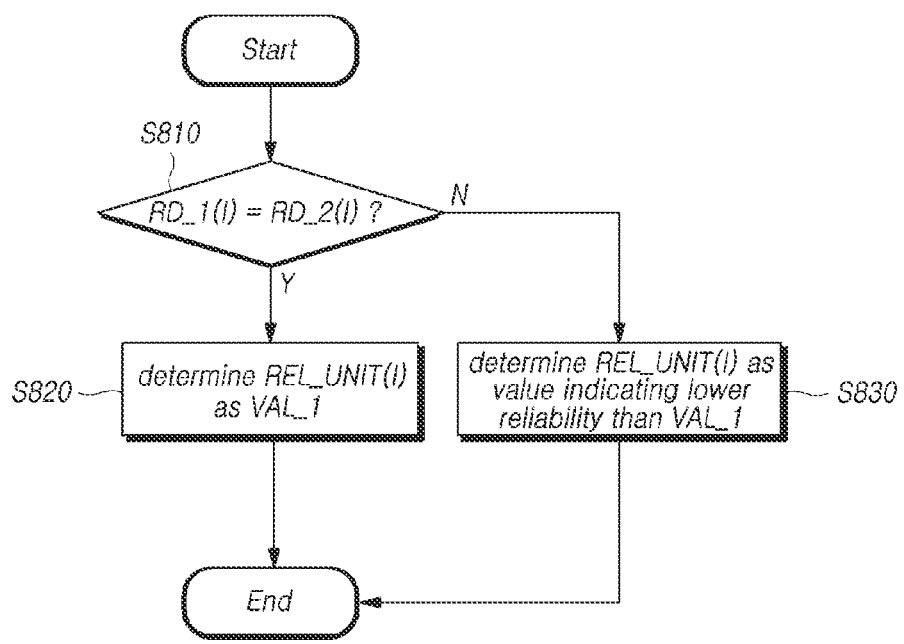
FIGS. 8 and 9 illustrate examples of an operation in which the controller determines a reliability data unit corresponding to the I-th bit of the read data according to embodiments of the present disclosure.
Figure 9:
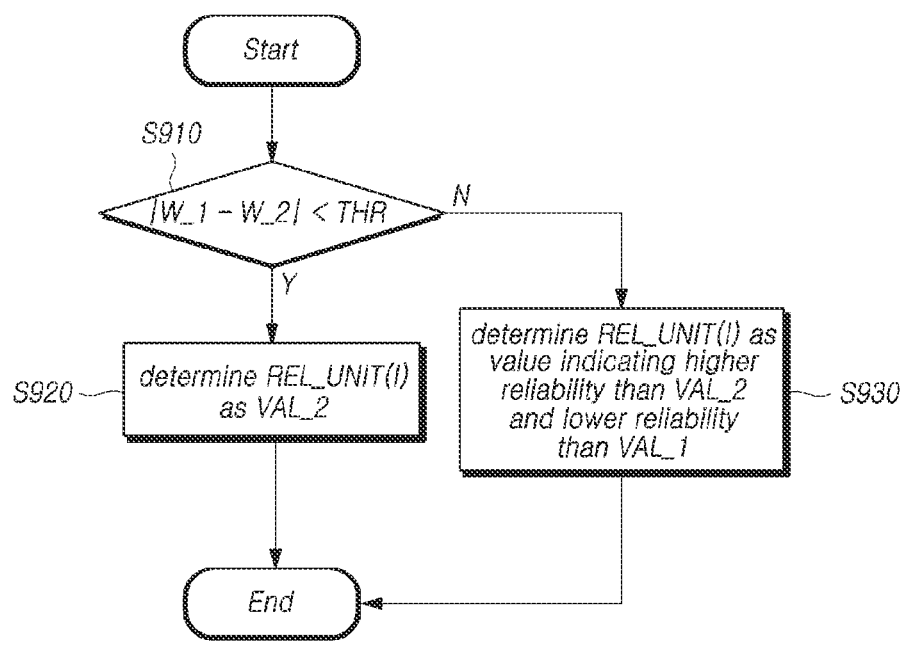

FIGS. 8 and 9 illustrate examples of an operation in which the controller 10 determines the reliability data unit REL_UNIT(I) corresponding to the I-th bit of the read data L_1 according to embodiments of the present disclosure.

Referring to FIG. 8, the processing circuit of the controller 10 may determine whether the I-th bit RD_1(I) of the first read data RD_1 is equal to the I-th bit RD_2(I) of the second read data RD_2 (S810).

When the I-th bit RD_1(I) of the first read data RD_1 is equal to the I-th bit RD_2(I) of the second read data RD_2 (S810—Y), the processing circuit 13 may set the value of the reliability data unit REL_UNIT(I) corresponding to the I-th bit of the read data L_1 as a first value VAL_1 (S820).

In this case, the first value VAL_1 may be, for example, a value indicating highest reliability that can be indicated by the reliability data unit REL_UNIT. For example, when the reliability data unit REL_UNIT is 2 bits and a larger value indicates higher reliability, the first value VAL_1 may be a binary number 11.

On the other hand, when the I-th bit RD_1(I) of the first read data RD_1 is not equal to the I-th bit RD_2(I) of the second read data RD_2 (S810—N), the processing circuit 13 may set the value of the reliability data unit REL_UNIT(I) corresponding to the I-th bit of the read data as a value indicating lower reliability than the first value VAL_1. (S830). For example, when the reliability data unit REL_UNIT is 2 bits and a larger value indicates higher reliability, the value of the reliability data unit REL_UNIT(I) may be less than binary number 11 (e.g., 01, 00).

Hereinafter, an example of a specific operation in which the processing circuit 13 sets the value of the reliability data REL_UNIT(I) corresponding to the I-th bit of the read data L_1 to a value smaller than the first value VAL_1 in operation S830 will be described with reference to FIG. 9.

Referring to FIG. 9, the processing circuit 13 of the controller 10 may determine whether a difference between the first syndrome weight W_1 and the second syndrome weight W_2 is less than a threshold difference value THR (S910).

When the difference between the first syndrome weight W_1 and the second syndrome weight W_2 is less than the threshold difference value THR (S910—Y), the processing circuit 13 may set the value of the reliability data unit REL_UNIT(I) corresponding to the I-th bit of the read data as a second value VAL_2 (S920).

In this case, the second value VAL_2 indicates lower reliability than the first value VAL_1 described in FIG. 8. For example, when the reliability data unit REL_UNIT is 2 bits and a larger value indicates higher reliability, the second value VAL_2 may be a binary number 00.

On the other hand, when the difference between the first syndrome weight W_1 and the second syndrome weight W_2 is greater than or equal to the threshold difference value THR (S910—N), the processing circuit 13 may set the value of the reliability data unit REL_UNIT(I) corresponding to the I-th bit of the read data as a value indicating lower reliability than the first value VALI, and higher reliability than the second value VAL_2 (S930).

For example, when the reliability data unit REL_UNIT is 2 bits and a larger value indicates higher reliability, the value of the reliability data unit REL_UNIT(I) corresponding to the I-th bit of the read data may be a binary number 10 or 01, which is less than the first value VAL_1 (e.g., binary number 11) and greater than the second value VAL_2 (e.g., binary number 00)

Figure 10:
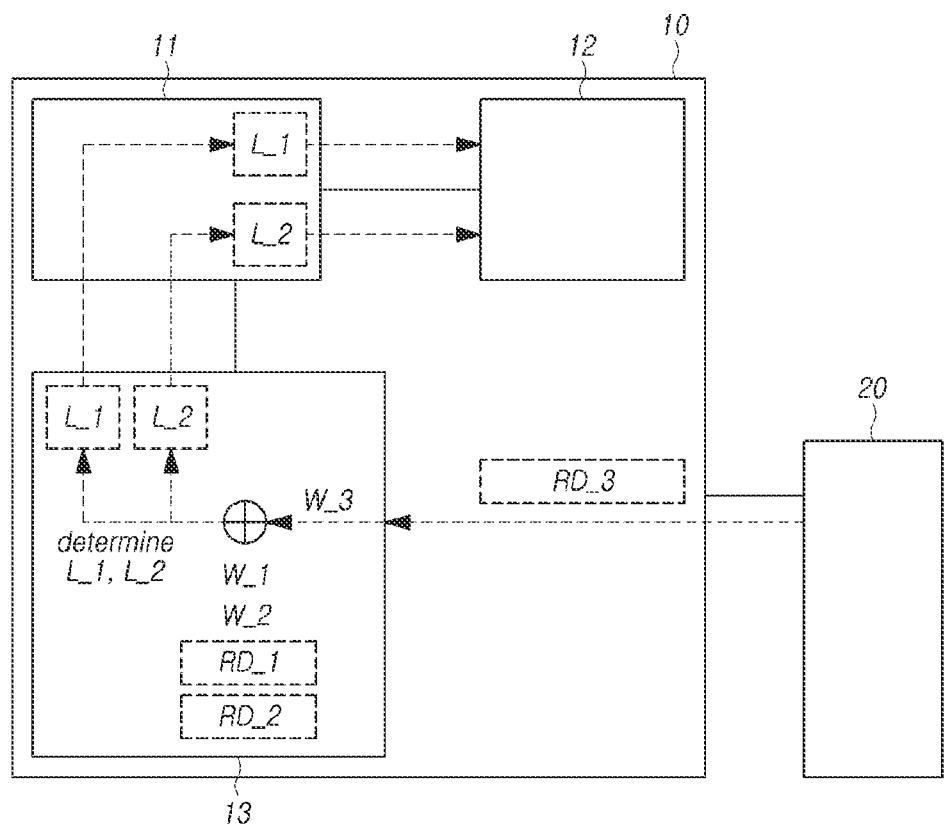
FIG. 10 illustrates another example of schematic operation of the controller according to embodiments of the present disclosure.

FIG. 10 illustrates another example of schematic operation of the controller 10 according to embodiments of the present disclosure.

Referring to FIG. 10, the processing circuit 13 of the controller 10 may read third read data RD_3 from the memory area 20 based on a third read bias. In this case, the third read bias is different from the first read bias RB_1 and the second read bias RB_2 described above.

The processing circuit 13 may calculate a third syndrome weight W_3, which is syndrome weight for the third read data RD_3.

After that, the processing circuit 13 may re-determine the read data L_1 and the reliability data hereinafter, this will be described in detail with reference to FIG. 11.

Figure 11:
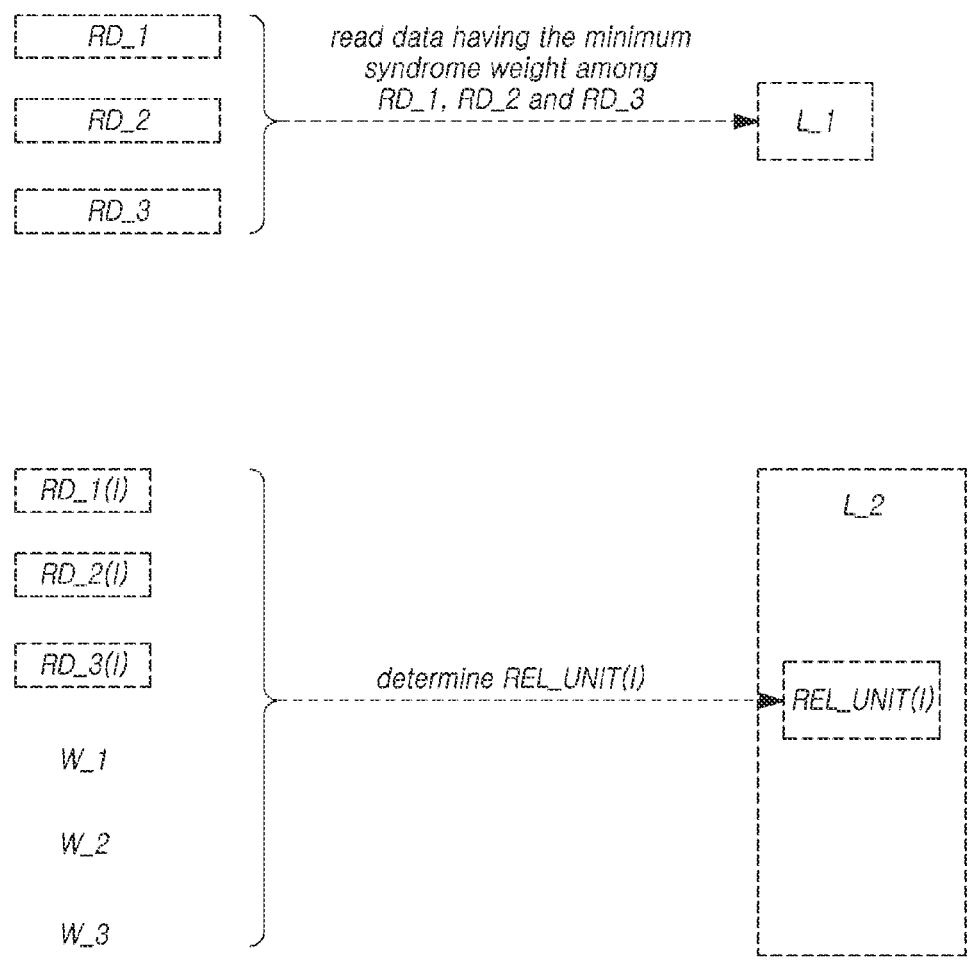
FIG. 11 illustrates an example of an operation in which the controller re-determines the read data and the reliability data according to embodiments of the present disclosure.

FIG. 11 illustrates an example of an operation in which the controller re-determines the read data L_1 and the reliability data L_2 according to embodiments of the present disclosure.

Referring to FIG. 11, the processing circuit 13 of the controller 10 may re-determine the read data as read data having a minimum syndrome weight among the first read data RD_1, the second read data RD_2 and the third read data RD_3.

For example, when the first syndrome weight W_1 is the smallest among the first syndrome weight W_1, the second syndrome weight W_2, and the third syndrome weight W_3, the processing circuit 13 may re-determine the read data L_1 as the first read data RD_1.

As another example, when the second syndrome weight W_2 is the smallest among the first syndrome weight W_1, the second syndrome weight W_2, and the third syndrome weight W_3, the processing circuit 13 may re-determine the read data L_1 as the second read data RD_2.

As another example, when the third syndrome weight W_3 is the smallest among the first syndrome weight W_1, the second syndrome weight W_2, and the third syndrome weight W_3, the processing circuit 13 may re-determine the read data L_1 as the third read data RD_3.

On the other hand, when there is a plurality of read data having the minimum syndrome weight among the first read data RD_1, the second read data RD_2, and the third read data RD_3, the processing circuit 13 may re-determine one of the plurality of read data as the read data L_1.

And the processing circuit 13 may re-determine the value of the reliability data unit REL_UNIT(I) corresponding to the I-th bit of the read data based on the I-th bit RD_1(I) of the first read data RD_1, the I-th bit RD_2(I) of the second read data RD_2, the I-th bit RD_3(I) of the third read data RD_3, the first syndrome weight W_1, the second syndrome weight W_2, and the third syndrome weight W_3. Hereinafter, this will be described in more detail with reference to FIGS. 12 to 15.

FIGS. 12 to 15 illustrate another example of an operation in which the controller 10 determines the reliability data unit REL_UNIT(I) corresponding to the I-th bit of the read data according to embodiments of the present disclosure.

Figure 12:
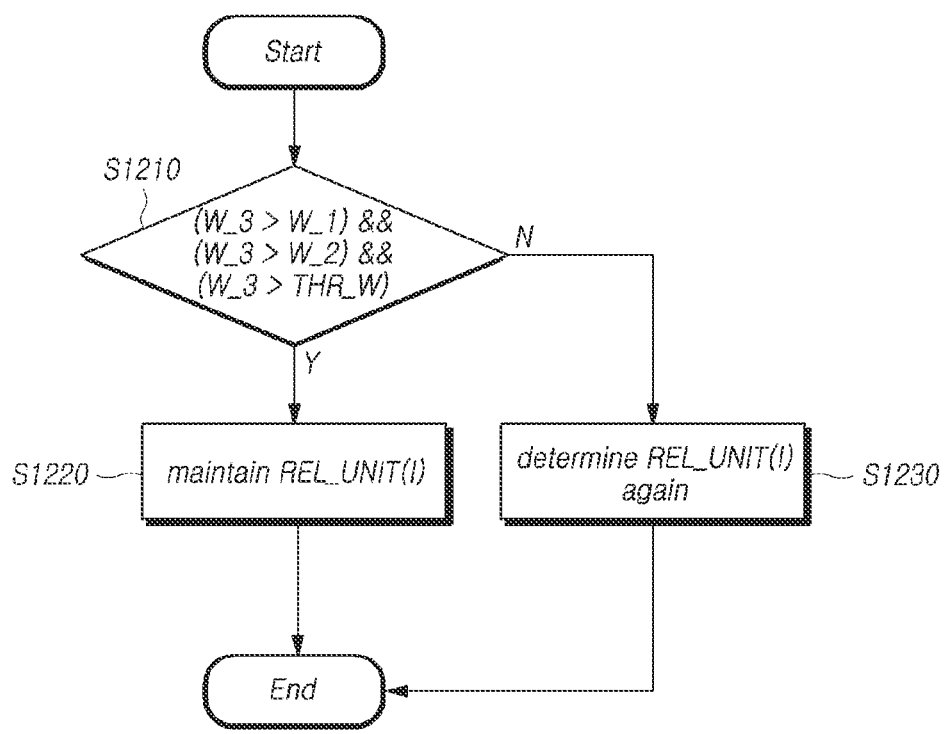
FIGS. 12 to 15 illustrate another example of an operation in which the controller determines the reliability data unit corresponding to the I-th bit of the read data according to embodiments of the present disclosure.

Referring to FIG. 12, the processing circuit 13 determines whether the third syndrome weight W_3 is greater than the first syndrome weight W_1 and the second syndrome weight W_2, and the third syndrome weight W_3 is greater than a threshold syndrome weight THR_W (S1210).

When the third syndrome weight W_3 is greater than the first syndrome weight W_1 and the second syndrome weight W_2, and the third syndrome weight W_3 is greater than the threshold syndrome weight THR_W (S1210—Y), the processing circuit 13 may maintain the value of the reliability data unit REL_UNIT(I) corresponding to the I-th bit of the read data L_1 (S1220). In this case, for example, the processing circuit 13 may skip the operation of re-determining the read data L_1 and the reliability data L_2 using the third read data RD_3. As another example, the processing circuit 13 may perform an operation of re-determining the read data L_1 and the reliability data L_2 again by using additional read data.

On the other hand, when the third syndrome weight W_3 is less than at least one of the first syndrome weight W_1 and the second syndrome weight W_2, or the third syndrome weight W_3 is equal to or less than the threshold syndrome weight THR_W (S1210—N), The processing circuit 13 may re-determine the value of the reliability data unit REL_UNIT(I) corresponding to the I-th bit of the read data L_1 (S1230).

Hereinafter, an example of a specific operation in which the processing circuit 13 re-determines the value of the reliability data unit REL_UNIT(I) corresponding to the I-th bit of the read data L_1 in operation S1230 will be described with reference to FIG. 13.

Figure 13:
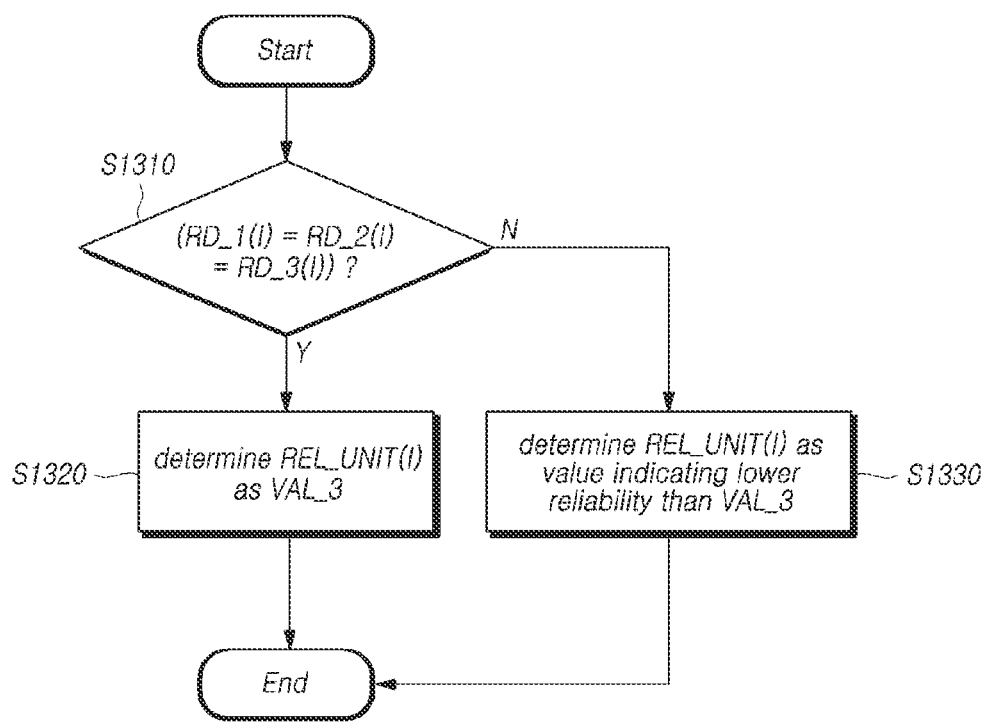

Referring to FIG. 13, the processing circuit 13 of the controller 10 may determine whether all the I-th bit RD_1(I) of the first read data RD_1, the I-th bit RD_2(I) of the second read data RD_2, and the I-th bit RD_3(I) of the third read data RD_3 are equal (S1310).

When all the I-th bit RD_1(I) of the first read data RD_1, the I-th bit RD_2(I) of the second read data RD_2, and the I-th bit RD_3(I) of the third read data RD_3 are equal (S1310—Y), the processing circuit 13 may determine the value of the reliability data unit REL_UNIT(I) corresponding to the I-th bit of the read data L_1 as a third value VAL_3 (S1320).

For example, the third value VAL_3 may be a value indicating the highest reliability that can be indicated by the reliability data unit REL_UNIT. For example, when the reliability data unit REL_UNIT is 2 bits and a larger value indicates higher reliability, the third value VAL_3 may be a binary number 11. Furthermore, the third value VAL_3 may be equal to the first value VAL_1 described with reference to FIG. 8.

On the other hand, when one of the I-th bit RD_1(I) of the first read data RD_1, the I-th bit RD_2(I) of the second read data RD_2, and the I-th bit RD_3(I) of the third read data RD_3 is different from the other two (S1310—N), the processing circuit 13 may determine the value of the reliability data unit REL_UNIT(I) corresponding to the I-th bit of the read data as a value indicating lower reliability than the third value VAL_3 (S1330).

Hereinafter, an example of a specific operation in which the processing circuit 13 sets the value of the reliability data unit REL_UNIT(I) corresponding to the I-th bit of the read data L_1 to a value indicating a lower reliability than the third value VAL_3 will be described with reference to FIG. 14.

Figure 14:
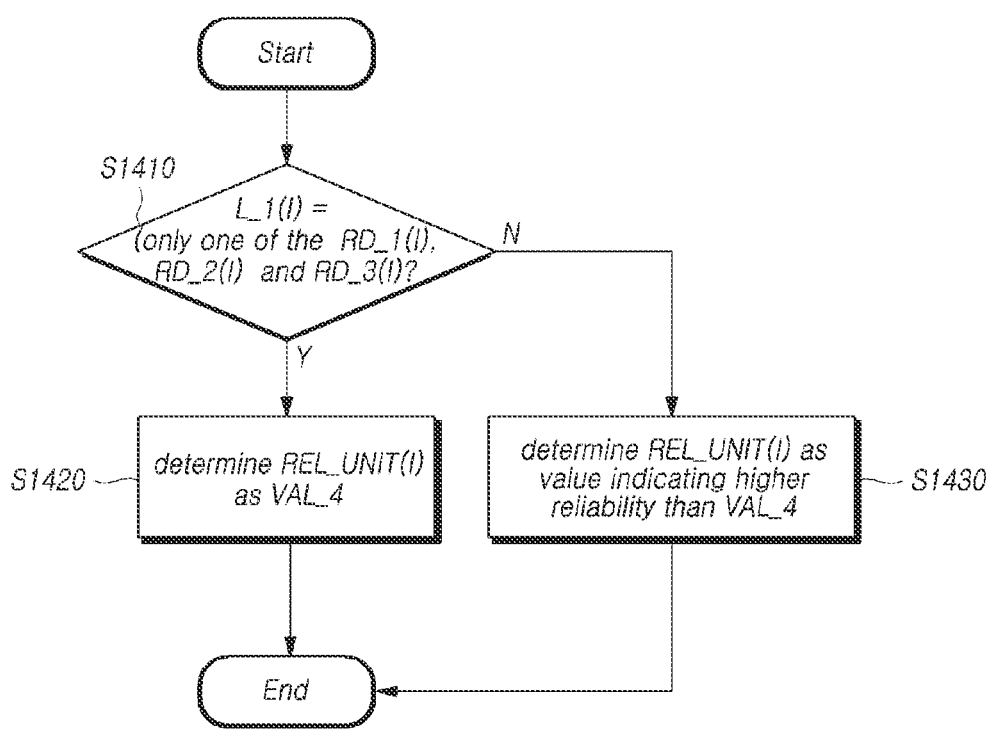

Referring to FIG. 14, the processing circuit 13 of the controller 10 may determine whether the I-th bit of the read data L_1 is equal to only one of the I-th bit RD_1(I) of the first read data RD_1, the I-th bit RD_2(I) of the second read data RD_2, and the I-th bit RD_3(I) of the third read data RD_3 (S1410).

When the I-th bit of the read data L_1 is equal to only one of the I-th bit RD_1(I) of the first read data RD_1, the I-th bit RD_2(I) of the second read data RD_2, and the I-th bit RD_3(I) of the third read data RD_3 (S1410—Y), the processing circuit 13 may determine the value of the reliability data unit REL_UNIT(I) corresponding to the I-th bit of the read data L_1 as a fourth value VAL_4 (S1420). In this case, the fourth value VAL_4 indicates lower reliability than the third value VAL_3.

For example, when the reliability data unit REL_UNIT is 2 bits and a larger value indicates higher reliability, the fourth value VAL_4 may be a binary number 00.

On the other hand, when the I-th bit of the read data L_1 is equal to two of the I-th bit RD_1(I) of the first read data the I-th bit RD_2(I) of the second read data RD_2 and the I-th bit RD_3(I) of the third read data RD_3 (S1410—N), the processing circuit 13 may determine the value of the reliability data unit REL_UNIT(I) corresponding to the I-th bit of the read data L_1 as a value indicating lower reliability than the third value VAL_3 and higher reliability than the fourth value VAL_4 (S1430).

For example, when the reliability data unit REL_UNIT is 2 bits and a larger value indicates higher reliability, the value of the reliability data unit REL_UNIT(I) corresponding to the I-th bit of the read data L_1 may be a binary number 10 or 11, which is less than the third value VAL_3 (binary number 11) and greater than the fourth value VAL_4 (binary number 00).

Hereinafter, an example of a specific operation of the processing circuit 13 setting the value of the reliability data unit REL_UNIT(I) corresponding to the I-th bit of the read data L_1 to a value indicating higher reliability than the fourth value VAL_4 will be described with reference to FIG. 15.

Figure 15:
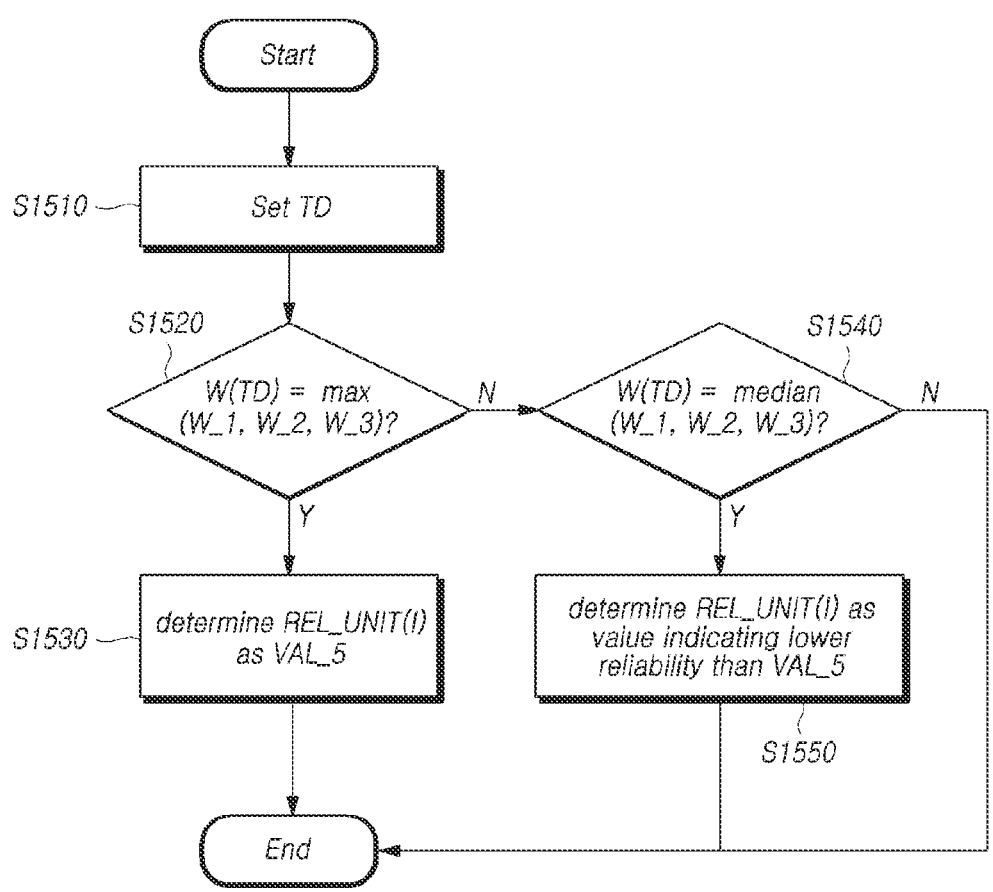

Referring to FIG. 15, the processing circuit 13 of the controller 10 may determine target data TD, which is read data among the first read data RD_1, the second read data RD_2, and the third read data RD_3 that the I-th bit is different from the I-th bit of the read data L_1 (S1510).

For example, when the I-th bit of the read data L_1 is 1, the I-th bit RD_1(I) of the first read data RD_1 is 1, the I-th bit RD_2(I) of the second read data RD_2 is 1, and the I-th bit RD_3(I) of the third read data RD_3 is 0, the target data TD may be determined as the third read data RD_3.

As another example, when the I-th bit of the read data L_1 is 1, the I-th bit RD_1(I) of the first read data RD_1 is 1, the I-th bit RD_2(I) of the second read data RD_2 is 0, and the I-th bit RD_3(I) of the third read data RD_3 is 1, the target data TD may be determined as the second read data RD_2.

The processing circuit 13 determines whether syndrome weight W(TD) of the target data TD is maximum syndrome weight among the first syndrome weight W_1, the second syndrome weight W_2, and the third syndrome weight W_3 (S1520).

When the syndrome weight W(TD) of the target data TD is maximum syndrome weight among the first syndrome weight the second syndrome weight W_2, and the third syndrome weight W_3 (S1520—Y), the processing circuit 13 may determine the value of the reliability data unit REL_UNIT(I) corresponding to the I-th bit of the read data L_1 as a fifth value VAL_5 indicating lower reliability than the third value VAL_3 and higher reliability than the fourth value VAL_4 (S1530).

For example, when the reliability data unit REL_UNIT is 2 bits and a larger value indicates higher reliability, the fifth value VAL_5 may be a binary number 10, which is less than the third value VAL_3 (binary number 11) and greater than the fourth value VAL_4 (binary number 00).

On the other hand, when the syndrome weight W(TD) of the target data TD is not maximum syndrome weight among the first syndrome weight W_1 the second syndrome weight W_2, and the third syndrome weight W_3 (S1520—N), the processing circuit 13 may determine whether the syndrome weight W(TD) of the target data TD is a median of the first syndrome weight W_1, the second syndrome weight W_2 and the third syndrome weight W_3 (S1540).

If the syndrome weight W(TD) of the target data TD is a median of the first syndrome weight W_1, the second syndrome weight W_2 and the third syndrome weight W_3, this means that the syndrome weight W(TD) is greater than one of the first syndrome weight W_1, the second syndrome weight W_2, and the third syndrome weight W_3 and is smaller than the other one.

When the syndrome weight W(TD) of the target data TD is a median of the first syndrome weight W_1, the second syndrome weight W_2 and the third syndrome weight W_3 (S1540—Y), the processing circuit 13 may determine the value of the reliability data unit REL_UNIT(I) corresponding to the I-th bit of the read data L_1 as a value indicating lower reliability than the fifth value VAL_5 and higher reliability than the fourth value VAL_4 (S1550).

For example, when the reliability data unit REL_UNIT is 2 bits and a larger value indicates higher reliability, the value of the reliability data unit REL_UNIT(I) corresponding to the I-th bit of the read data L_1 may be a binary number 01, which indicates lower reliability than the fifth value VAL_5 (binary number 10).

When the syndrome weight W(TD) of the target data TD is minimum syndrome weight among the first syndrome weight W_1, the second syndrome weight W_2, and the third syndrome weight W_3 (S1540—N), the processing circuit 13 does not perform an operation of re-determining the value of the reliability data unit REL_UNIT(I) corresponding to the I-th bit of the read data L_1.

Figure 16:
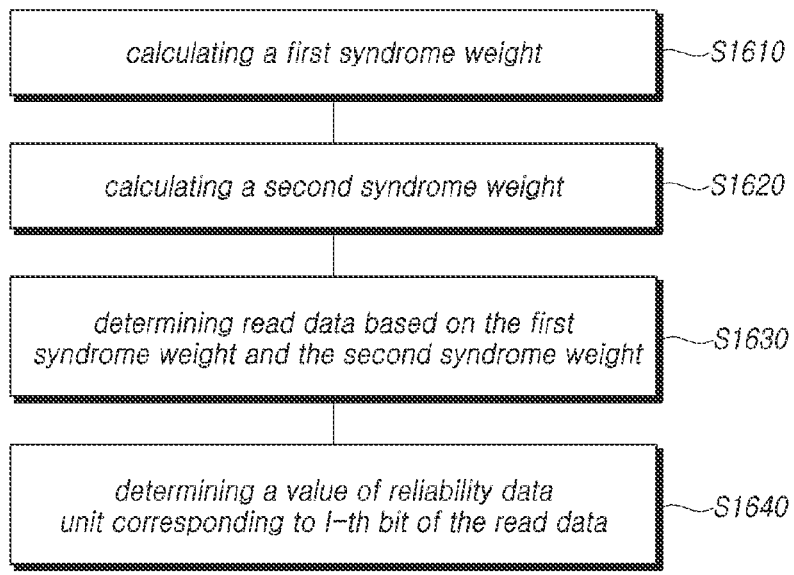
FIG. 16 illustrates an operating method of the controller according to embodiments of the present disclosure.

FIG. 16 illustrates an operating method of the controller according to embodiments of the present disclosure.

Referring to FIG. 16, the operating method of the controller 10 may include calculating a first syndrome weight W_1, which is syndrome weight corresponding to first read data RD_1 which is read from a memory area 20 based on a first read bias RB_1 (S1610).

The operating method of the controller 10 may include calculating a second syndrome weight W_2, which is a syndrome weight corresponding to second read data RD_2 which is read from the memory area 20 based on a second read bias RB_2 (S1620).

The operating method of the controller 10 may include determining, as the read data L_1, one from among the first read data L_1 and the second read data L_2 based on the first syndrome weight W_1 and the second syndrome weight W_2 (S1630).

For example, the operation S1630 determines, as the read data L_1, the first read data RD_1 when the first syndrome weight W_1 is less than or equal to the second syndrome weight W_2 and determines, as the read data L_1, the second read data RD_2 when the first syndrome weight W_1 is greater than the second syndrome weight W_2.

The operating method of the controller 10 may include determining a value of reliability data unit REL_UNIT(I) corresponding to I-th bit of the read data based on an I-th bit RD_1(I) of the first read data RD_1, an I-th bit RD_2(I) of the second read data RD_2 and a difference between the first syndrome weight W_1 and the second syndrome weight W_2 (S1640).

For example, the operation S1640 may determine the value of the reliability data unit REL_UNIT(I) corresponding to I-th bit of the read data L_1 as a first value VAL_1 when the I-th bit of the first read data RD_1 is equal to the I-th bit of the second read data RD_2.

The operation S1640 may determine the value of the reliability data unit REL_UNIT(I) corresponding to I-th bit of the read data L_1 as a value indicating lower reliability than the first value VAL_1 when the I-th bit of the first read data RD_1 and the I-th bit of the second read data RD_2 are different from each other.

In this case, when the difference between the first syndrome weight W_1 and the second syndrome weight is less than a threshold difference value THR, the value of the reliability data unit REL_UNIT(I) corresponding to I-th bit of the read data may be determined as a second value VAL_2 indicating lower reliability than the first value VAL_1, On the other hand, when the difference between the first syndrome weight W_1 and the second syndrome weight W_2 is greater than or equal to the threshold difference value TNR, the value of the reliability data unit REL_UNIT(I) corresponding to I-th bit of the read data may be determined as a value indicating lower reliability than the first value VAL_1 and higher reliability than the second value VAL_2.

The operating method of the controller 10 may further include reading third read data RD_3 from the memory area 20 based on a third read bias; calculating a third syndrome weight W_3, which is syndrome weight for the third read data RD_3; re-determining, as the read data L_1, one corresponding to a minimum syndrome weight among the first read data RD_1, the second read data RD_2 and the third read data RD_3; and re-determining the value of the reliability data unit REL_UNIT(I) corresponding to the I-th bit of the read data L_1 based on the I-th bit RD_1(I) of the first read data RD_1, the I-th bit RD_2(I) of the second read data RD_2, an I-th bit RD_3(I) of the third read data RD_3, the first syndrome weight W_1, the second syndrome weight W_2 and the third syndrome weight W_3.

For example, the re-determining the value of the reliability data unit REL_UNIT(I) corresponding to the I-th bit of the read data L_1 may maintain the value of the reliability data unit REL_UNIT(I) corresponding to the I-th bit of the read data L_1 when the third syndrome weight is greater than the first syndrome weight W_1 and the second syndrome weight W_2, and the third syndrome weight W_3 is greater than a threshold syndrome weight THR_W.

As another example, the re-determining the value of the reliability data unit REL_UNIT(I) corresponding to the I-th bit of the read data L_1 may determine the value of the reliability data unit REL_UNIT(I) corresponding to the I-th bit of the read data L_1 as a third value VAL_3 when all the I-th bit of the first read data RD_1(I), the I-th bit of the second read data RD_2(I) and the I-th bit of the third read data RD_3(I) are equal, and may determine the value of the reliability data unit REL_UNIT(I) corresponding to the I-th bit of the read data L_1 as a value indicating lower reliability than the third value VAL_3 when one is different from the remaining two among the I-th bit RD_1(I) of the first read data RD_1, the I-th bit RD_2(I) of the second read data RD_2 and the I-th bit RD_3(I) of the third read data RD_3.

In this case, when the I-th bit of the read data L_1 is equal to only one of the I-th bit RD_1(I) of the first read data RD_1, the I-th bit RD_2(I) of the second read data RD_2 and the I-th bit RD_3(I) of the third read data RD_3, the value of the reliability data unit REL_UNIT(I) corresponding to the I-th bit of the read data may be determined as a fourth value VAL_4 indicating lower reliability than the third value. When the I-th bit of the read data L_1 is equal to two of the I-th bit RD_1(I) of the first read data RD_1, the I-th bit RD_2(I) of the second read data RD_2 and the I-th bit RD(3) of the third read data RD_3, the value of the reliability data unit REL_UNIT(I) corresponding to the I-th bit of the read data L_1 may be determined as a value indicating lower reliability than the third value VAL_3 and higher reliability than the fourth value VAL_4.

In this case, the re-determining the value as the value indicating lower reliability than the third value VAL_3 and higher reliability than the fourth value VAL_4 when the I-th bit of the read data L_1 is equal to two of the I-th bit RD_1(I) of the first read data RD_1, the I-th bit RD_2(I) of the second read data RD_2 and the I-th bit RD(3) of the third read data RD_3 may include i) determining target data TD, the I-th bit of which is different from the I-th bit of the read data L_1, among the first read data RD_1, the second read data RD_2 and the third read data RD_3; ii) determining the value of the reliability data unit REL_UNIT(I) corresponding to the I-th bit of the read data L_1 as a fifth value VAL_5 indicating lower reliability than the third value VAL_3 and higher reliability than the fourth value VAL_4 when the syndrome weight of the target data TD is a maximum syndrome weight among the first syndrome weight W_1, the second syndrome weight W_2 and the third syndrome weight W_3; and determining the value of the reliability data unit REL_UNIT(I) corresponding to the I-th bit of the read data L_1 as a value indicating lower reliability than the fifth value VAL_5 when the syndrome weight of the target data TD is a median of the first syndrome weight W_1, the second syndrome weight W_2 and the third syndrome weight W_3.

Figure 17:
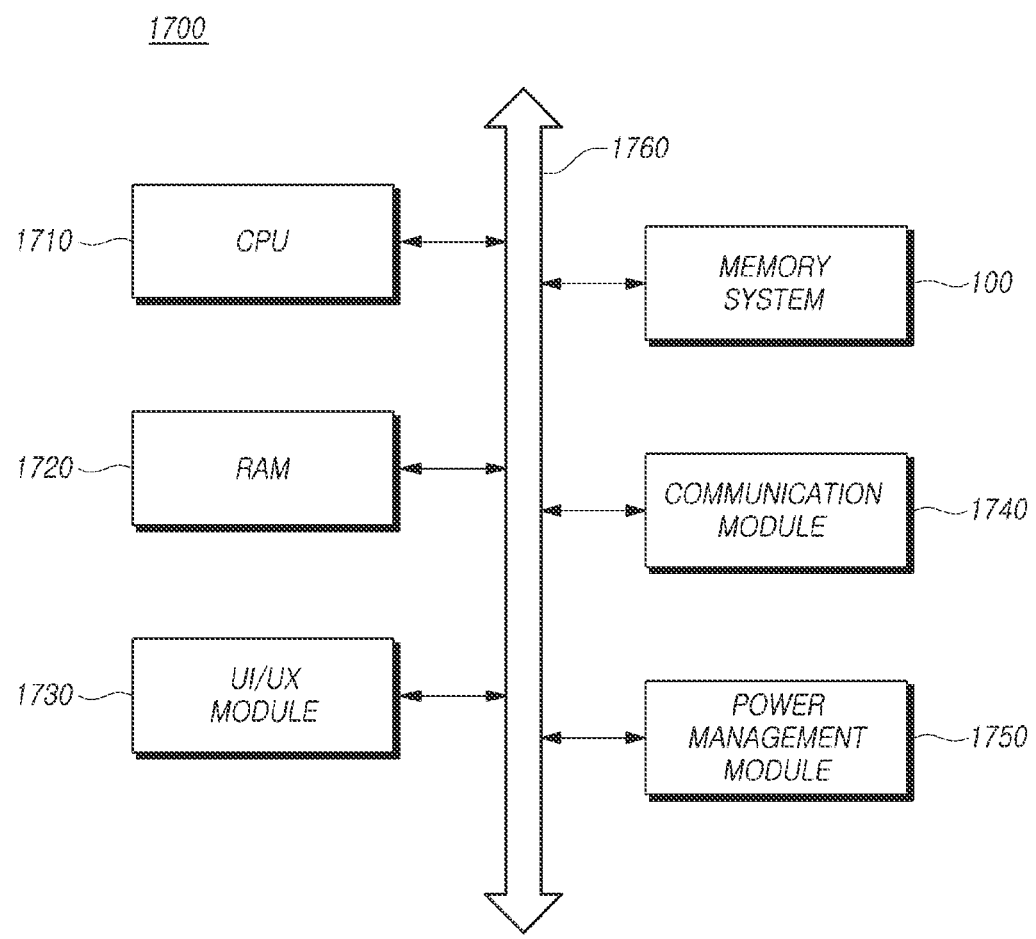
FIG. 17 is a diagram illustrating the configuration of a computing system based on some embodiments of the present disclosure.

FIG. 17 is a diagram illustrating the configuration of a computing system 1700 based on an embodiment of the present disclosure.

Referring to FIG. 17, the computing system 1700 based on an embodiment of the present disclosure may include: a memory system 100 electrically connected to a system bus 1760; a CPU 1710 configured to control the overall operation of the computing system 1700; a RAM 1720 configured to store data and information related to operations of the computing system 1700; a user interface/user experience (UI/UX) module 1730 configured to provide the user with a user environment; a communication module 1740 configured to communicate with an external device as a wired and/or wireless type; and a power management module 1750 configured to manage power used by the computing system 1700.

The computing system 1700 may be a personal computer (PC) or may include a mobile terminal such as a smartphone, a tablet or various electronic devices.

The computing system 1700 may further include a battery for supplying an operating voltage, and may further include an application chipset, a graphic-related module, a camera image processor, and a DRAM. Other elements would be apparent to a person skilled in the art.

The memory system 100 may include not only a device configured to store data in a magnetic disk such as a hard disk drive (HDD), but also a device configured to store data in a nonvolatile memory such as a solid state drive (SSD), a universal flash storage device, or an embedded MMC (eMMC) device. The non-volatile memory may include a read only memory (ROM), a programmable ROM (PROM), an electrically programmable ROM (EPROM), an electrically erasable and programmable ROM (EEPROM), a flash memory, a phase-change RAM (PRAM), a magnetic RAM (MRAM), a resistive RAM (RRAM), a ferroelectric RAM (FRAM), and the like. In addition, the memory system 100 may be implemented as storage devices of various types and mounted inside various electronic devices.

Based on embodiments of the present disclosure described above, the operation delay time of the memory system may be advantageously reduced or minimized. In addition, based on an embodiment of the present disclosure, an overhead occurring in the process of calling a specific function may be advantageously reduced or minimized. Although various embodiments of the present disclosure have been described with particular specifics and varying details for illustrative purposes, those skilled in the art will appreciate that various modifications, additions and substitutions may be made based on what is disclosed or illustrated in the present disclosure without departing from the spirit and scope of the invention as defined in the following claims. Furthermore, the embodiments may be combined to form additional embodiments.

What is claimed is:

1. A controller comprising:
a storage memory configured to store N-bit read data and N reliability data units each indicating reliability information for a corresponding bit of the read data;
a decoder configured to execute a decoding operation for the read data based on the reliability data units; and
a processing circuit configured to:
read first read data from a memory area located outside the controller based on a first read bias,
read second read data from the memory area based on a second read bias,
calculate a first syndrome weight corresponding to a number of syndrome elements having a preset value in a first syndrome of the first read data,
calculate a second syndrome weight corresponding to a number of syndrome elements having a preset value in a second syndrome of the second read data,
determine, as the read data, one of the first read data and the second read data based on which of the first syndrome weight and the second syndrome weight is smaller, and
determine a value of a reliability data unit corresponding to I-th bit of the read data based on an I-th bit of the first read data, an I-th bit of the second read data and a difference between the first syndrome weight and the second syndrome weight.

2. The controller of claim 1, wherein the processing circuit determines, as the read data, the first read data when the first syndrome weight is less than or equal to the second syndrome weight, and the second read data when the first syndrome weight is greater than the second syndrome weight.

3. The controller of claim 2, wherein the processing circuit determines the value of the reliability data unit corresponding to I-th bit of the read data as:
- a first value when the I-th bit of the first read data is equal to the I-th bit of the second read data, and
- a value indicating lower reliability than the first value based on a difference between the first syndrome weight and the second syndrome weight when the I-th bit of the first read data and the I-th bit of the second read data are different from each other.

4. The controller of claim 3, wherein the processing circuit determines, when the I-th bit of the first read data and the I-th bit of the second read data are different from each other, the value of the reliability data unit corresponding to I-th bit of the read data as:
- a second value indicating lower reliability than the first value when the difference between the first syndrome weight and the second syndrome weight is less than a threshold difference value, and
- a value indicating lower reliability than the first value and higher reliability than the second value when the difference between the first syndrome weight and the second syndrome weight is greater than or equal to the threshold difference value.

5. The controller of claim 1, wherein the processing circuit is further configured to:
- read third read data from the memory area based on a third read bias,
- calculate a third syndrome weight corresponding to the third read data,
- re-determine, as the read data, one corresponding to a minimum syndrome weight among the first read data, the second read data and the third read data, and
- re-determine the value of the reliability data unit corresponding to the I-th bit of the read data based on the I-th bit of the first read data, the I-th bit of the second read data, an I-th bit of the third read data, the first syndrome weight, the second syndrome weight and the third syndrome weight.

6. The controller of claim 5, wherein the processing circuit re-determines the read data by maintaining the value of the reliability data unit corresponding to the I-th bit of the read data when the third syndrome weight is greater than the first syndrome weight and the second syndrome weight, and the third syndrome weight is greater than a threshold syndrome weight.

7. The controller of claim 5, wherein the processing circuit re-determines the value of the reliability data unit corresponding to I-th bit of the read data by:
- determining the value of the reliability data unit corresponding to the I-th bit of the read data as a third value when all the I-th bit of the first read data, the I-th bit of the second read data and the I-th bit of the third read data are equal, and
- determining the value of the reliability data unit corresponding to the I-th bit of the read data as a value indicating lower reliability than the third value when one read data is different from the remaining two read data among the I-th bit of the first read data, the I-th bit of the second read data and the I-th bit of the third read data.

8. The controller of claim 7, wherein the processing circuit determines, when one read data is different from the remaining two read data among the I-th bits of the first to third read data, the value of the reliability data unit corresponding to I-th bit of the read data as:
- a fourth value indicating lower reliability than the third value when the I-th bit of the read data is equal to only one of the I-th bit of the first read data, the I-th bit of the second read data and the I-th bit of the third read data, and
- a value indicating lower reliability than the third value and higher reliability than the fourth value when the I-th bit of the read data is equal to two of the I-th bit of the first read data, the I-th bit of the second read data and the I-th bit of the third read data.

9. The controller of claim 8, wherein the processing circuit determines the value of the reliability data unit corresponding to I-th bit of the read data as the value indicating lower reliability than the third value and higher reliability than the fourth value when the I-th bit of the read data is equal to two of the I-th bit of the first read data, the I-th bit of the second read data and the I-th bit of the third read data, by:
- determining target data, the I-th bit of which is different from the I-th bit of the read data among the first read data, the second read data and the third read data,
- determining the value of the reliability data unit corresponding to the I-th bit of the read data as a fifth value indicating lower reliability than the third value and higher reliability than the fourth value when the syndrome weight of the target data is a maximum syndrome weight among the first syndrome weight, the second syndrome weight and the third syndrome weight, and
- determining the value as a value indicating lower reliability than the fifth value when the syndrome weight of the target data is a median of the first syndrome weight, the second syndrome weight and the third syndrome weight.

10. An operating method of a controller, the operating method comprising:
- calculating a first syndrome weight corresponding to a number of syndrome elements having a preset value in a first syndrome of first read data, the first read data having been read from a memory area located outside of the controller based on a first read bias;
- calculating a second syndrome weight corresponding to a number of syndrome elements having a preset value in a second syndrome of second read data, the second read data having been read from the memory area based on a second read bias;
- determining, as read data, one of the first read data and the second read data based on which of the first syndrome weight and the second syndrome weight is smaller; and
- determining a value of reliability data unit corresponding to I-th bit of the read data based on an I-th bit of the first read data, an I-th bit of the second read data and a difference between the first syndrome weight and the second syndrome weight.

11. The operating method of claim 10, wherein the determining the read data includes:
- determining the first read data as the read data when the first syndrome weight is less than or equal to the second syndrome weight; and
- determining the second read data as the read data when the first syndrome weight is greater than the second syndrome weight.

12. The operating method of claim 11, wherein the determining the value includes determining the value of the reliability data unit corresponding to I-th bit of the read data as:
- a first value when the I-th bit of the first read data is equal to the I-th bit of the second read data, and
- a value indicating lower reliability than the first value based on the difference between the first syndrome weight and the second syndrome weight when the I-th bit of the first read data and the I-th bit of the second read data are different from each other.

13. The operating method of claim 12, wherein the determining the value, when the I-th bit of the first read data and the I-th bit of the second read data are different from each other, includes determining the value of the reliability data unit corresponding to I-th bit of the read data as:
- a second value indicating lower reliability than the first value when the difference between the first syndrome weight and the second syndrome weight is less than a threshold difference value, and
- a value indicating lower reliability than the first value and higher reliability than the second value when the difference between the first syndrome weight and the second syndrome weight is greater than or equal to the threshold difference value.

14. The operating method of claim 10, further comprising:
- calculating a third syndrome weight corresponding to third read data read from the memory area according to a third read bias;
- re-determining, as the read data, one corresponding to a minimum syndrome weight among the first read data, the second read data and the third read data; and
- re-determining the value of the reliability data unit corresponding to the I-th bit of the read data based on the I-th bit of the first read data, the I-th bit of the second read data, an I-th bit of the third read data, the first syndrome weight, the second syndrome weight and the third syndrome weight.

15. The operating method of claim 14, wherein the re-determining the value includes maintaining the value of the reliability data unit corresponding to the I-th bit of the read data when the third syndrome weight is greater than the first syndrome weight and the second syndrome weight and the third syndrome weight is greater than a threshold syndrome weight.

16. The operating method of claim 14, wherein the re-determining the value includes:
- determining the value of the reliability data unit corresponding to I-th bit of the read data as a third value when all the I-th bit of the first read data, the I-th bit of the second read data and the I-th bit of the third read data are equal; and
- determining the value as a value indicating lower reliability than the third value when one read data is different from the remaining two read data among the I-th bit of the first read data, the I-th bit of the second read data and the I-th bit of the third read data.

17. The operating method of claim 16, wherein the determining the value, when one read data is different from the remaining two read data among the I-th bits of the first to third read data, includes determining the value of the reliability data unit corresponding to I-th bit of the read data as:
- a fourth value indicating lower reliability than the third value when the I-th bit of the read data is equal to only one of the I-th bit of the first read data, the I-th bit of the second read data and the I-th bit of the third read data, and
- a value indicating lower reliability than the third value and higher reliability than the fourth value when the I-th bit of the read data is equal to two of the I-th bit of the first read data, the I-th bit of the second read data and the I-th bit of the third read data.

18. The operating method of claim 17, wherein the determining the value of the reliability data unit corresponding to I-th bit of the read data as the value indicating lower reliability than the third value and higher reliability than the fourth value when the I-th bit of the read data is equal to two of the I-th bit of the first read data, the I-th bit of the second read data and the I-th bit of the third read data, includes:
- determining target data, the I-th bit of which is different from the I-th bit of the read data among the first read data, the second read data and the third read data;
- determining the value as a fifth value indicating lower reliability than the third value and higher reliability than the fourth value when the syndrome weight of the target data is a maximum syndrome weight among the first syndrome weight, the second syndrome weight and the third syndrome weight; and
- determining the value as a value indicating lower reliability than the fifth value when the syndrome weight of the target data is a median of the first syndrome weight, the second syndrome weight and the third syndrome weight.

\* \* \* \* \*